(12) United States Patent
Hayashi et al.

(10) Patent No.: US 10,243,128 B2
(45) Date of Patent: Mar. 26, 2019

(54) THERMOELECTRIC CONVERSION ELEMENT AND THERMOELECTRIC CONVERSION MODULE

(71) Applicant: FUJIFILM Corporation, Tokyo (JP)

(72) Inventors: Naoyuki Hayashi, Ashigara-kami-gun (JP); Hiroki Sugiura, Ashigara-kami-gun (JP); Toshiaki Aoai, Ashigara-kami-gun (JP)

(73) Assignee: FUJIFILM Corporation, Tokyo (JP)

( * ) Notice: Subject to any disclaimer, the term of this patent is extended or adjusted under 35 U.S.C. 154(b) by 52 days.

(21) Appl. No.: 15/451,786

(22) Filed: Mar. 7, 2017

(65) Prior Publication Data

US 2017/0179363 A1     Jun. 22, 2017

Related U.S. Application Data

(63) Continuation of application No. PCT/JP2015/070962, filed on Jul. 23, 2015.

(30) Foreign Application Priority Data

Sep. 8, 2014   (JP) ................................. 2014-182086
Jan. 27, 2015   (JP) ................................. 2015-013428

(51) Int. Cl.
    *H01L 35/04*      (2006.01)
    *H01L 35/28*      (2006.01)
    (Continued)

(52) U.S. Cl.
    CPC .............. *H01L 35/24* (2013.01); *B82Y 30/00* (2013.01); *C01B 32/158* (2017.08); *H01L 35/02* (2013.01);
    (Continued)

(58) Field of Classification Search
    CPC ......... H01L 35/02; H01L 35/04; H01L 35/06; H01L 35/10; H01L 35/12; H01L 35/28; H01L 35/32
    See application file for complete search history.

(56) References Cited

U.S. PATENT DOCUMENTS

2007/0144573 A1*   6/2007   Mihara .................... C03C 17/23
                                                                             136/205
2012/0227780 A1*   9/2012   Kurihara ................. H01L 27/16
                                                                             136/224

(Continued)

FOREIGN PATENT DOCUMENTS

JP           04190572 A    *   7/1992
JP           3981738 B2       9/2007

(Continued)

OTHER PUBLICATIONS

JP-04190572-A English equiv of the abstract, Ishizawa, Maki (Year: 1992).*

(Continued)

*Primary Examiner* — Susan D Leong
(74) *Attorney, Agent, or Firm* — Birch, Stewart, Kolasch & Birch, LLP

(57) ABSTRACT

The present invention has a first substrate having a high thermal conduction portion which has a thermal conductivity higher than that of other regions in a plane direction, a thermoelectric conversion layer which is formed on the first substrate, consists of an organic material, and has a thermoelectric conversion material having a positive Seebeck coefficient, a second substrate which is formed on the thermoelectric conversion layer and has a high thermal conduction portion having a thermal conductivity higher than that of other regions in the plane direction and in which the high thermal conduction portion does not completely overlap the high thermal conduction portion of the first substrate in the (Continued)

plane direction, and a pair of electrodes which are connected to the thermoelectric conversion layer and consist of a metal material having a negative Seebeck coefficient. As a result, there are provided a thermoelectric conversion element and a thermoelectric conversion module which can generate heat with excellent efficiency by using a thermoelectric conversion material consisting of an organic material.

12 Claims, 7 Drawing Sheets

(51) Int. Cl.
  *H01L 35/32*   (2006.01)
  *H01L 35/24*   (2006.01)
  *B82Y 30/00*   (2011.01)
  *H01L 35/30*   (2006.01)
  *H01L 35/34*   (2006.01)
  *H01L 35/02*   (2006.01)
  *C01B 32/158*   (2017.01)

(52) U.S. Cl.
  CPC .............. *H01L 35/30* (2013.01); *H01L 35/32* (2013.01); *H01L 35/34* (2013.01); *C01B 2202/22* (2013.01); *C01B 2202/24* (2013.01); *Y10S 977/742* (2013.01); *Y10S 977/753* (2013.01); *Y10S 977/948* (2013.01)

(56) References Cited

U.S. PATENT DOCUMENTS

| | | |
|---|---|---|
| 2013/0333738 A1 | 12/2013 | Suemori et al. |
| 2014/0338716 A1 | 11/2014 | Nakajima et al. |
| 2016/0222256 A1* | 8/2016 | Kato ........................ H01L 35/32 |
| 2016/0260883 A1 | 9/2016 | Yonekura et al. |

FOREIGN PATENT DOCUMENTS

| | | |
|---|---|---|
| JP | 2011-71338 A | 4/2011 |
| JP | 2012-4333 A | 1/2012 |
| JP | 2012-222244 A | 11/2012 |
| JP | 2013-115359 A | 6/2013 |
| JP | 2014-154761 A | 8/2014 |
| WO | WO 2012/121133 A1 | 9/2012 |
| WO | WO 2013/121486 A1 | 8/2013 |
| WO | WO 2014/010286 A1 | 1/2014 |
| WO | WO-2015046253 A1 * | 4/2015 ............ H01L 35/32 |
| WO | WO 2015/098574 A1 | 7/2015 |

OTHER PUBLICATIONS

International Preliminary Report on Patentability and English translation of the Written Opinion of the International Searching Authority (Forms PCT/IB/338, PCT/IB/373 and PCT/ISA/237), dated Mar. 23, 2017, for International Application No. PCT/JP2015/070962.

Japanese Notification of Reasons for Refusal for Japanese Application No. 2016-547762, dated May 30, 2017, with a machine translation.

International Search Report, issued in PCT/JP2015/070962 (PCT/ISA/210), dated Sep. 8, 2015.

Material Stage, "Novel Organic Thermoelectric Materials", 2002, vol. 1, No. 10, pp. 32-36, (Partial Translation).

Written Opinion of the International Searching Authority, issued in PCT/JP2015/070962 (PCT/ISA/237), dated Sep. 8, 2015.

Japanese Office Action, dated Jul. 25, 2017, for Japanese Application No. 2016-547762, with English machine translation.

* cited by examiner

THERMOELECTRIC CONVERSION ELEMENT AND THERMOELECTRIC CONVERSION MODULE

CROSS-REFERENCE TO RELATED APPLICATIONS

This application is a Continuation of PCT International Application No. PCT/JP2015/070962 filed on Jul. 23, 2015, which claims priority under 35 U.S.C. § 119(a) to Japanese Patent Application No. 2014-182086 filed on Sep. 8, 2014 and Japanese Patent Application No. 2015-013428 filed on Jan. 27, 2015. Each of the above application(s) is hereby expressly incorporated by reference, in its entirety, into the present application.

BACKGROUND OF THE INVENTION

1. Field of the Invention

The present invention relates to a thermoelectric conversion element, which has a thermoelectric conversion layer consisting of an organic material and has an excellent thermoelectric conversion performance, and a thermoelectric conversion module using the thermoelectric conversion element.

2. Description of the Related Art

Thermoelectric conversion materials that enable the interconversion of heat energy and electric energy are used in a thermoelectric conversion element such as a power generating element generating power from heat or a Peltier element.

The thermoelectric conversion element can directly convert heat energy into electric power and has an advantage of not requiring a moving part. Therefore, by providing a thermoelectric conversion module (power generating device), which is obtained by connecting a plurality of thermoelectric conversion elements, in a heat exhaust site such as an incinerator or various factory facilities, it is possible to obtain electric power in a simple manner without needing to incur operational costs.

Regarding the aforementioned thermoelectric conversion element, as a thermoelectric conversion element using an inorganic material as a thermoelectric conversion material, a so-called π-type thermoelectric conversion element described in JP3981738B is known.

The π-type thermoelectric conversion element has a constitution in which a pair of electrodes separating from each other are provided, an n-type thermoelectric conversion material and a p-type thermoelectric conversion material that also separate from each other are provided on one of the electrodes and the other respectively, and the upper surfaces of the two thermoelectric conversion materials are connected to each other through the electrodes.

By arranging a plurality of thermoelectric conversion elements such that the n-type thermoelectric conversion material and the p-type thermoelectric conversion material are alternately disposed and connecting lower electrodes of the thermoelectric conversion materials in series, a thermoelectric conversion module is formed.

For example, Material Stage Vol. 1, No. 10, 2002, pp. 32 to 36 describes a thermoelectric conversion module (thermopile) obtained by connecting π-type thermoelectric conversion elements using a conductive polymer polyaniline which is a p-type thermoelectric conversion material and Pt which is an n-type thermoelectric conversion material.

A general thermoelectric conversion element including the π-type thermoelectric conversion element is constituted with an electrode on a plate-like substrate, a thermoelectric conversion layer (power generating layer) on the electrode, and a plate-like electrode on the thermoelectric conversion layer.

That is, in a general thermoelectric conversion element, the thermoelectric conversion layer is interposed between the electrodes in a thickness direction, and a temperature difference is caused in the thickness direction of the thermoelectric conversion layer, thereby converting heat energy into electric energy.

In contrast, JP3981738B describes a thermoelectric conversion element using a substrate having a high thermal conduction portion and a low thermal conduction portion, in which heat energy is converted into electric energy by causing a temperature difference in a plane direction of a thermoelectric conversion layer, not in the thickness direction of the thermoelectric conversion layer.

Specifically, JP3981738B describes a thermoelectric conversion element having a constitution in which a flexible film substrate constituted with two kinds of material having different thermal conductivities are disposed on both surfaces of a thermoelectric conversion layer formed of a P-type material and an N-type material, and the materials having different thermal conductivities are positioned on the outer surface of the substrates in a direction opposite to a direction along which electricity is conducted.

SUMMARY OF THE INVENTION

In the thermoelectric conversion element having the constitution described in JP3981738B, a temperature difference is caused in the plane direction of the thermoelectric conversion layer due to the high thermal conduction portion provided in the substrate, thereby converting heat energy into electric energy. Accordingly, even if the thermoelectric conversion layer is thin, by increasing the distance in which the temperature difference is caused, power can be generated with excellent efficiency. Furthermore, because the thermoelectric conversion layer can be made into a sheet-like layer, the flexibility thereof is excellent as well, and a thermoelectric conversion element or a thermoelectric conversion module which can be easily installed on a curved surface or the like is obtained.

However, in recent years, the requirements that thermoelectric conversion elements need to satisfy have increasingly become strict, and the thermoelectric conversion element described in JP3981738B having a constitution, in which a temperature difference is caused in the plane direction of the thermoelectric conversion layer by using a substrate having a high thermal conduction portion and a low thermal conduction portion, has been required to further improve the thermoelectric conversion performance thereof.

The present invention has been made to solve the aforementioned problems of the related art, and an object thereof is to provide a thermoelectric conversion element having higher thermoelectric conversion efficiency, which has a thermoelectric conversion layer consisting of an organic material and in which heat energy is converted into electric energy by causing a temperature difference in a plane direction of the thermoelectric conversion layer by using a high thermal conduction portion of a substrate, and a thermoelectric conversion module using the thermoelectric conversion element.

In order to achieve the aforementioned object, the present invention provides a thermoelectric conversion element comprising a first substrate having a high thermal conduction portion which has a thermal conductivity higher than that of other regions in at least a portion in a plane direction, a thermoelectric conversion layer which is formed on the first substrate, consists of an organic material, and has a positive Seebeck coefficient, a second substrate which is formed on the thermoelectric conversion layer and has a high thermal conduction portion having a thermal conductivity higher than that of other regions in at least a portion in the plane direction and in which the high thermal conduction portion does not completely overlap the high thermal conduction portion of the first substrate in the plane direction, and a pair of electrodes which are connected to the thermoelectric conversion layer such that the thermoelectric conversion layer is interposed between the electrodes in the plane direction and use a metal material having a negative Seebeck coefficient.

In the thermoelectric conversion element of the present invention, it is preferable that each of the pair of electrodes covers a portion of an upper surface of the thermoelectric conversion layer in the plane direction.

Furthermore, it is preferable that the thermoelectric conversion element of the present invention has a connection portion, which connects the electrodes to the thermoelectric conversion layer and consists of a material having an electric conductivity higher than that of the metal material constituting the electrodes, in at least one of the pair of electrodes.

It is preferable that the electrodes and the thermoelectric conversion layer are directly connected to each other and connected to the connection portion as well.

It is preferable that the electrodes and the thermoelectric conversion layer separate from each other and are connected to each other through the connection portion.

It is preferable that the thermoelectric conversion element of the present invention has an adhesive layer between the first substrate and the pair of electrodes.

It is preferable that the thermoelectric conversion element of the present invention has an insulating inorganic oxide film or silicon nitride film that covers the thermoelectric conversion layer and the pair of electrodes.

It is preferable that an end face of the thermoelectric conversion layer in the plane direction has a tapered shape.

It is preferable that the thermoelectric conversion layer contains carbon nanotubes.

It is preferable that the metal material having a negative Seebeck Coefficient is Ni or a Ni alloy.

The present invention also provides a thermoelectric conversion module comprising a plurality of the thermoelectric conversion elements of the present invention that is connected to each other in series.

It is preferable that the thermoelectric conversion module of the present invention has a heat dissipating fin contacting the high thermal conduction portion of any one of the first and second substrates.

It is preferable that the heat dissipating fin and the high thermal conduction portion are bonded to each other by a thermally conductive adhesive sheet or a thermally conductive adhesive.

According to the present invention, in the thermoelectric conversion element in which heat energy is converted into electric energy by causing a temperature difference in the plane direction of the thermoelectric conversion layer by using the high thermal conduction portion and the low thermal conduction portion provided in the substrate, by combining the thermoelectric conversion layer having a positive Seebeck coefficient with the electrodes using a metal having a negative Seebeck coefficient, it is possible to obtain a thermoelectric conversion element and a thermoelectric conversion module having a higher thermoelectric conversion performance.

DESCRIPTION OF THE PREFERRED EMBODIMENTS

Hereinafter, a thermoelectric conversion element and a thermoelectric conversion module of the present invention will be specifically described based on suitable examples shown in the attached drawings.

Figure 1A:
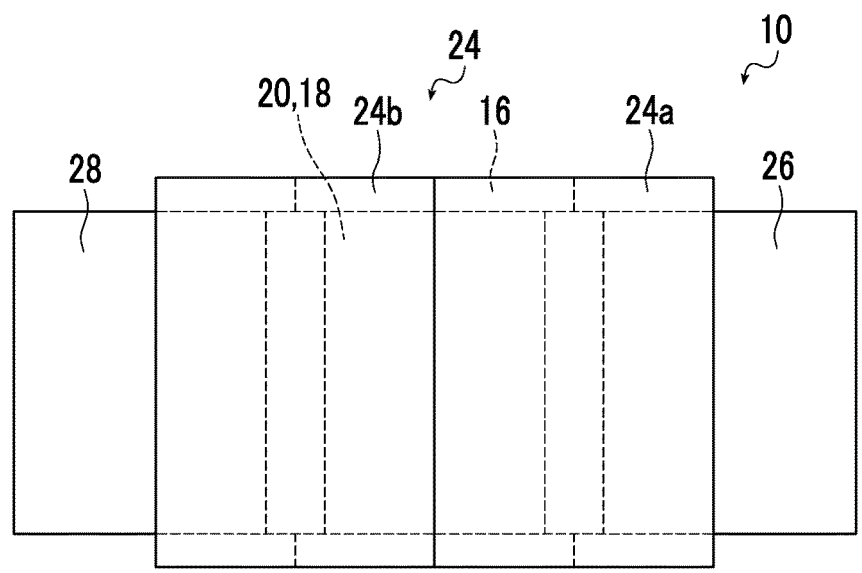
FIGS. 1A to 1C are views schematically showing an example of a thermoelectric conversion element of the present invention.
Figure 1B:
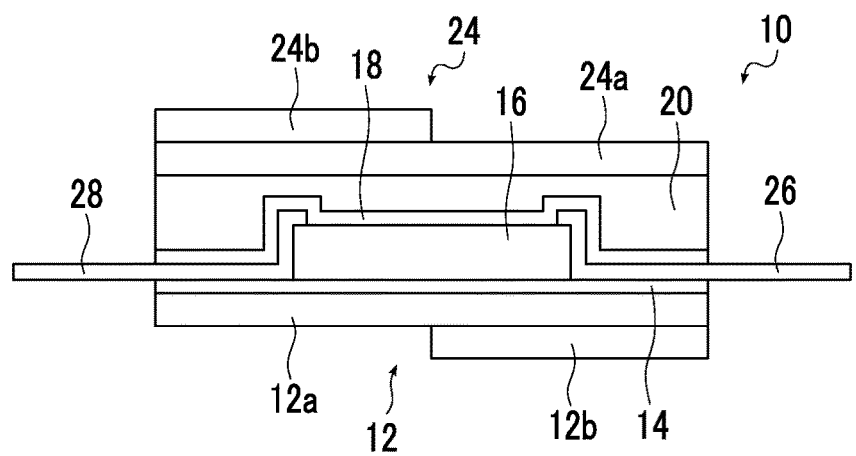
Figure 1C:
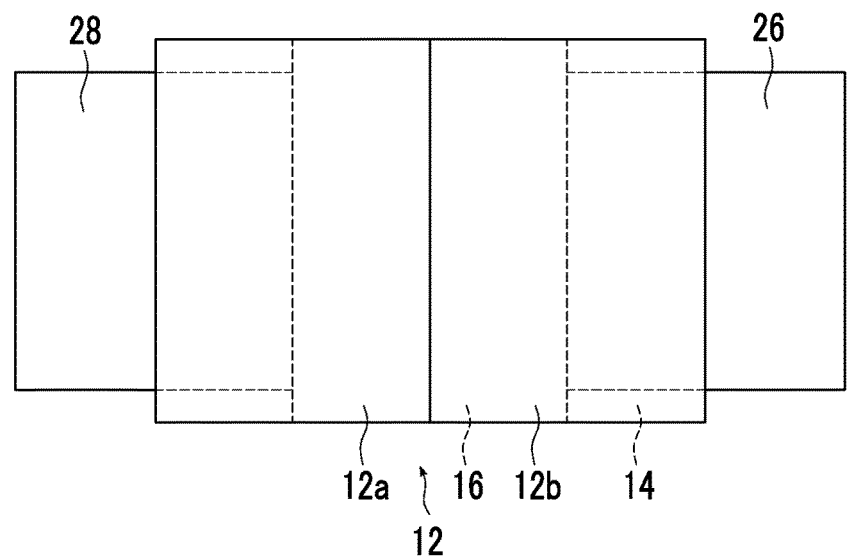

FIGS. 1A to 1C are views schematically showing an example of the thermoelectric conversion element of the present invention. FIG. 1A is a top view obtained when FIG. 1B is seen from above the paper. FIG. 1B is a front view obtained when the thermoelectric conversion element is seen in a plane direction of a substrate or the like which will be described later. FIG. 1C is a bottom view obtained when FIG. 1B is seen from below the paper.

A thermoelectric conversion element 10 shown FIGS. 1A to 1C is basically constituted with a first substrate 12, an adhesive layer 14, a thermoelectric conversion layer 16, an oxide layer 18, a pressure sensitive adhesive layer 20, a second substrate 24, and electrodes 26 and 28.

Specifically, the adhesive layer 14 is on the first substrate 12, the thermoelectric conversion layer 16 and the electrodes 26 and 28 are on the adhesive layer 14, the oxide layer 18 covers the thermoelectric conversion layer 16 and the electrodes 26 and 28, the pressure sensitive adhesive layer 20 is on the oxide layer 18, and the second substrate 24 is on the pressure sensitive adhesive layer 20. The electrodes 26 and 28 are provided such that the thermoelectric conversion layer 16 is interposed between the electrodes in a substrate surface direction of the first substrate 12. The electrodes 26 and 28 constitute an electrode pair.

In the following description, the substrate surface direction of the first substrate 12 is simply referred to as a "plane direction" as well.

As shown in FIGS. 1A to 1C, the first substrate 12 has a low thermal conduction portion 12a and a high thermal conduction portion 12b. Likewise, the second substrate 24 has a low thermal conduction portion 24a and the high thermal conduction portion 24b. As illustrated in the drawings, the two substrates are disposed such that the high thermal conduction portions thereof are in positions different from the connection direction of the electrodes 26 and 28. The connection direction of the electrodes 26 and 28 is in other words a direction in which electricity is conducted.

The constitutions of the two substrates are the same as each other, except that the substrates are disposed in different positions and have different plane direction and the front and back sides thereof face different directions. Therefore, except for a case where the first substrate 12 and the second substrate 24 need to be differentiated from each other, the first substrate 12 will be described as a typical example.

The first substrate 12 (second substrate 24) of the thermoelectric conversion element 10 has a constitution in which the rectangular plate-like (sheet-like) high thermal conduction portion 12b is laminated on the surface of the low thermal conduction portion 12a such that half of the surface of the rectangular plate-like (sheet-like) low thermal conduction portion 12a is covered.

Accordingly, within one surface of the first substrate 12, half of the region of the surface in the plane direction is occupied by the low thermal conduction portion 12a, and the other half of the region of the surface is occupied by the high thermal conduction portion 12b. Furthermore, the other surface of the first substrate 12 is totally occupied by the low thermal conduction portion 12a.

Figure 5A:
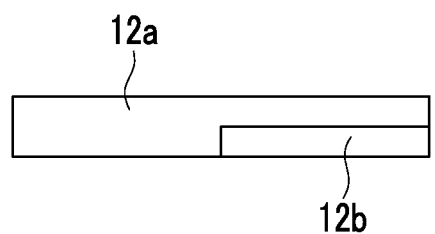
FIGS. 5A and 5B are schematic views showing another example of a substrate used in the thermoelectric conversion element of the present invention.

For the first substrate (second substrate) in the thermoelectric conversion element of the present invention, in addition to the constitution in which the high thermal conduction portion is laminated on the surface of the low thermal conduction portion, various constitutions can be used. For example, as schematically shown in FIG. 5A, the first substrate may have a constitution in which concave portions are formed in half of the region of one surface of a plate-like substance that will become the low thermal conduction portion 12a, and the high thermal conduction portion 12b is incorporated into the concave portions such that the surface becomes uniform.

As the low thermal conduction portion 12a, it is possible to use substances consisting of various materials, such as a glass plate, a ceramic plate, and a plastic film, as long as they have insulating properties and heat resistance sufficient for making the thermoelectric conversion layer 16, the electrode 26, and the like.

A plastic film is preferably used as the low thermal conduction portion 12a. It is preferable to use a plastic film as the low thermal conduction portion 12a, because then weight lightening or cost reduction can be achieved, and the thermoelectric conversion element 10 having flexibility can be formed.

Examples of the plastic film that can be used in the low thermal conduction portion 12a include films (sheet-like substances/plate-like substances) consisting of a polyethylene resin such as polyethylene terephthalate, polyethylene isophthalate, polyethylene naphthalate, polybutylene terephthalate, poly(1,4-cyclohexylenedimethylene-terephthalate), or polyethylene-2,6-phthalenedicarboxylate, a resin such as polyimide, polycarbonate, polypropylene, polyether sulfone, a cycloolefin polymer, polyether ether ketone (PEEK), or triacetyl cellulose (TAC), glass epoxy, liquid crystal polyester, and the like.

Among these, in view of thermal conductivity, heat resistance, solvent resistance, ease of availability, economic efficiency, and the like, a film consisting of polyimide, polyethylene terephthalate, polyethylene naphthalate, or the like is suitably used.

As the high thermal conduction portion 12b, for example, films (sheet-like substances/plate-like substances) consisting of various materials can be used as long as the thermal conductivity thereof is higher than that of the low thermal conduction portion 12a.

Specifically, in view of thermal conductivity and the like, examples thereof include various metals such as gold (Au), silver (Ag), copper (Cu), and aluminum (Al). Among these, in view of thermal conductivity, economic efficiency, and the like, Cu and Al are suitably used.

In the present invention, a thickness of the first substrate 12, a thickness of the high thermal conduction portion 12b, and the like may be appropriately set according to the materials forming the high thermal conduction portion 12b and the low thermal conduction portion 12a, a size of the thermoelectric conversion element 10, and the like. The thickness of the first substrate 12 is a thickness of the low thermal conduction portion 12a in a region free of the high thermal conduction portion 12b.

A size of the first substrate 12 in the plane direction, a proportion of an area of the high thermal conduction portion 12b within the first substrate 12 in the plane direction, and the like may be appropriately set according to the materials forming the low thermal conduction portion 12a and the high thermal conduction portion 12b, the size of the thermoelectric conversion element 10, and the like. The size of the first substrate 12 in the plane direction is, in other words, the size of the first substrate 12 determined at the time when the substrate is seen in a direction orthogonal to the substrate surface.

Moreover, the position of the high thermal conduction portion 12b in the plane direction within the first substrate 12 is not limited to the example illustrated in the drawing, and various positions can be adopted.

For example, within the first substrate 12, the high thermal conduction portion 12b may be included in the low thermal conduction portion 12a in the plane direction. Alternatively, a portion of the high thermal conduction portion 12b may be positioned at the end of the low thermal conduction portion 12a in the plane direction, and other regions of the high thermal conduction portion 12b may be included in the low thermal conduction portion 12a. That is, the high thermal conduction portion 12b may be provided such that a portion of the outer circumference thereof contacts the low thermal conduction portion 12a in the plane direction and other regions thereof are included in the low thermal conduction portion 12a.

In addition, the first substrate 12 may have a plurality of high thermal conduction portions 12b in the plane direction.

In a preferred aspect in which a temperature difference is easily caused between the first substrate 12 and the second substrate 24 within the thermoelectric conversion element 10 shown in FIG. 1, both of the first substrate 12 and the second substrate 24 are provided such that the high thermal conduction portion 12b and the high thermal conduction portion 24b are positioned on the outside in the lamination direction.

However, in addition to this, the present invention may also have a constitution in which both of the first substrate 12 and the second substrate 24 are provided such that the high thermal conduction portion 12b and the high thermal conduction portion 24b are positioned on the inside in the lamination direction. Alternatively, a constitution may be adopted in which the first substrate 12 is provided such that the high thermal conduction portion 12b is positioned on the outside in the lamination direction, and the second substrate 24 is provided such that the high thermal conduction portion 24b is positioned on the inside in the lamination direction.

In a case where the high thermal conduction portion is formed of a conductive material such as a metal and positioned on the inside in the lamination direction, in order for insulating properties to be able to be established between the thermoelectric conversion layer 16 and the electrodes 26 and 28, an insulating layer or the like need to be formed between these.

In the thermoelectric conversion element 10, the adhesive layer 14 is formed on a surface, on which the high thermal conduction portion 12b is not formed, of the first substrate 12.

If the thermoelectric conversion element 10 has the adhesive layer 14 as described above, the adhesiveness between the first substrate 12 and the electrodes 26 and 28 is improved, and hence a thermoelectric conversion element (thermoelectric conversion module) having excellent mechanical strength such as bending resistance is obtained.

For the adhesive layer 14, various substances can be used according to the materials forming the first substrate 12 (low thermal conduction portion 12a) and the electrodes 26 and 28, as long as the substances can establish the adhesiveness between the two electrodes and the first substrate 12.

As will be described later, in the thermoelectric conversion element 10 of the present invention, as the materials forming the electrodes 26 and 28, one or more materials among nickel (Ni), a Ni alloy, Al, an Al alloy, and platinum (Pt) are suitably used.

In a case where the electrodes 26 and 28 are formed of these materials, examples of the adhesive layer 14 include layers consisting of silicon oxide ($SiO_2$), aluminum oxide ($Al_2O_3$), titanium oxide ($TiO_2$), chromium (Cr), titanium (Ti), and the like.

In a case where the adhesive layer 14 is formed of a metal oxide such as silicon oxide, the adhesive layer 14 can also act as a gas barrier layer that protects the thermoelectric conversion layer 16 from moisture passing through the first substrate 12.

A thickness of the adhesive layer 14 may be appropriately set according to the material forming the adhesive layer 14 such that an intended adhesion is obtained between the electrode 26 and the electrode 28.

Specifically, the thickness is preferably 10 to 1,000 nm, and more preferably 50 to 200 nm.

The thickness of the adhesive layer 14 is preferably equal to or greater than 10 nm and particularly preferably equal to or greater than 50 nm, because then the adhesiveness between the electrode 26, the electrode 28, and the first substrate 12 is obtained.

Furthermore, the thickness of the adhesive layer 14 is preferably equal to or less than 1,000 nm and particularly preferably equal to or less than 200 nm, because then the thermoelectric conversion element 10 (thermoelectric conversion module) can be made into a thin film, the thermoelectric conversion element 10 having excellent flexibility can be obtained, heat flowing into the thermoelectric conversion layer 16 increases, and a power generation capacity of the thermoelectric conversion element 10 can be improved.

The thermoelectric conversion layer 16 and the electrodes 26 and 28 are provided on the adhesive layer 14.

In the thermoelectric conversion element, for example, due to heating that occurs by the contact with a heat source and the like, a temperature difference is caused. According to the temperature difference, a difference of carrier density occurs in the direction of the temperature difference inside the thermoelectric conversion layer 16, and hence electric power is generated. In the example illustrated in the drawing, for example, a heat source is provided on the first substrate 12 side such that a temperature difference is caused between the first substrate 12 (particularly, the high thermal conduction portion 12b) and the second substrate 24 (particularly, the high thermal conduction portion 24b), and in this way, electric power is generated. Furthermore, by connecting wiring to electrodes 26 and 28, the electric power (electric energy) generated by heating or the like is extracted.

In the thermoelectric conversion element 10 of the present invention, the thermoelectric conversion layer 16 basically consists of an organic material and can adopt all of the various constitutions using known thermoelectric conversion materials, as long as the materials have a positive Seebeck coefficient. Having a positive Seebeck coefficient means showing p-type properties.

Specific examples of the thermoelectric conversion materials from which the thermoelectric conversion layer 16 as described above is obtained include an organic material such as a conductive polymer or a conductive nanocarbon material.

Examples of the conductive polymer include a polymer compound having a molecular structure of a conjugated system (conjugated system polymer). Specific examples thereof include known π-conjugated polymers such as polyaniline, polyphenylene vinylene, polypyrrole, polythiophene, polyfluorene, acetylene, polyphenylene, and the like. Particularly, polydioxythiophene can be suitably used.

Specific examples of the conductive nanocarbon material include carbon nanotubes, carbon nanofiber, graphite, graphene, carbon nanoparticles, and the like. One kind of these may be used singly, or two or more kinds thereof may be used in combination.

In the following description, carbon nanotubes are referred to as "CNT" as well.

Among the above materials, CNT is preferably used because then thermoelectric conversion characteristics are further improved.

CNT is categorized into single-layer CNT consisting of one sheet of carbon film (graphene sheet) wound in the form of a cylinder, double-layer CNT consisting of two graphene sheets wound in the form of concentric circles, and multilayer CNT consisting of a plurality of graphene sheets wound in the form of concentric circles. In the present invention, each of the single-layer CNT, the double-layer CNT, and the multilayer CNT may be used singly, or two or more kinds thereof may be used in combination. Particularly, the single-layer CNT and the double-layer CNT excellent in conductivity and semiconductor characteristics are preferably used, and the single-layer CNT is more preferably used.

The single-layer CNT may be semiconductive or metallic. Furthermore, semiconductive CNT and metallic CNT may be used in combination. In a case where both of the semiconductive CNT and the metallic CNT are used, a content ratio between the CNTs in a composition can be appropriately adjusted according to the use of the composition. In addition, CNT may contain a metal or the like, and CNT containing fullerene molecules and the like may be used.

An average length of CNT used in the present invention is not particularly limited and can be appropriately selected according to the use of the composition. Specifically, from the viewpoint of ease of manufacturing, film formability, conductivity, and the like, the average length of CNT is preferably 0.01 to 2,000 μm, more preferably 0.1 to 1,000

μm, and particularly preferably 1 to 1,000 μm, though the average length also depends on an inter-electrode distance.

A diameter of CNT used in the present invention is not particularly limited. From the viewpoint of durability, transparency, film formability, conductivity, and the like, the diameter is preferably 0.4 to 100 nm, more preferably equal to or less than 50 nm, and particularly preferably equal to or less than 15 nm.

Particularly, in a case where the single-layer CNT is used, the diameter is preferably 0.5 to 2.2 nm, more preferably 1.0 to 2.2 nm, and particularly preferably 1.5 to 2.0 nm.

CNT contained in the obtained conductive composition contains defective CNT in some cases. Because the defectiveness of CNT deteriorates the conductivity of the composition, it is preferable to reduce the amount of the defective CNT. The amount of defectiveness of CNT in the composition can be estimated by a G/D ratio between a G band and a D band in a Raman spectrum. If the G/D ratio is high, the composition can be assumed to be a CNT material with a small amount of defectiveness. In the present invention, the G/D ratio of the composition is preferably equal to or higher than 10 and more preferably equal to or higher than 30.

In the present invention, modified or processed CNT can also be used. Examples of the modification or processing method include a method of incorporating a ferrocene derivative or nitrogen-substituted fullerene (azafullerene) into CNT, a method of doping CNT with an alkali metal (potassium or the like) or a metallic element (indium or the like) by an ion doping method, a method of heating CNT in a vacuum, and the like.

In a case where CNT is used, in addition to the single-layer CNT or the multilayer CNT, nanocarbons such as carbon nanohorns, carbon nanocoils, carbon nanobeads, graphite, graphene, amorphous carbon, and the like may be contained in the composition.

In a case where CNT is used in the thermoelectric conversion layer 16, CNT may contain a dopant (acceptor). Examples of the dopant include halogen (iodine, bromine, or the like), Lewis acid ($PF_5$, $AsF_5$, or the like), protonic acid (hydrochloric acid, sulfuric acid, or the like), transition metal halide ($FeCl_3$, $SnCl_4$, or the like), a metal oxide (molybdenum oxide, vanadium oxide, or the like), an organic electron-accepting substance, and the like. Examples of the organic electron-accepting substance suitably include a tetracyanoquinodimethane (TCNQ) derivative such as 2,3,5,6-tetrafluoro-7,7,8,8-tetracyanoquinodimethane, 2,5-dimethyl-7,7,8,8-tetracyanoquinodimethane, 2-fluoro-7,7,8,8-tetracyanoquinodimethane, or 2,5-difluoro-7,7,8,8-tetracyanoquinodimethane, a benzoquinone derivative such as 2,3-dichloro-5,6-dicyano-p-benzoquinone or tetrafluoro-1,4-benzoquinone, 5,8H-5,8-bis(dicyanomethylene)quinoxaline, dipyrazino[2,3-f:2',3'-h]quinoxaline-2,3,6,7,10,11-hexacarbonitrile, and the like.

Among these, in view of the stability of the materials, the compatibility with CNT, and the like, organic electron-accepting substances such as a TCNQ derivative or a benzoquinone derivative is suitably exemplified.

One kind of dopant may be used singly, or two or more kinds thereof may be used in combination.

In the thermoelectric conversion element 10 of the present invention, the thermoelectric conversion layer 16 obtained by dispersing the aforementioned thermoelectric conversion material in a resin material (binder) is suitably used.

Particularly, the thermoelectric conversion layer 16 obtained by dispersing a conductive nanocarbon material in a resin material is more suitably exemplified. Especially, the thermoelectric conversion layer 16 obtained by dispersing CNT in a resin material is particularly suitably exemplified because this makes it possible to obtain high conductivity.

As the resin material, it is possible to use various known nonconductive resin materials (polymers).

Specifically, it is possible to use various known resin materials such as a vinyl compound, a (meth)acrylate compound, a carbonate compound, an ester compound, an epoxy compound, a siloxane compound, and gelatin.

More specifically, examples of the vinyl compound include polystyrene, polyvinyl naphthalene, polyvinyl acetate, polyvinyl phenol, polyvinyl butyral, and the like. Examples of the (meth)acrylate compound include polymethyl (meth)acrylate, polyethyl (meth)acrylate, polyphenoxy (poly)ethylene glycol (meth)acrylate, polybenzyl (meth)acrylate, and the like. Examples of the carbonate compound include bisphenol Z-type polycarbonate, bisphenol C-type polycarbonate, and the like. Examples of the ester compound include amorphous polyester.

Among these examples, polystyrene, polyvinyl butyral, a (meth)acrylate compound, a carbonate compound, and an ester compound are preferable, and polyvinyl butyral, polyphenoxy(poly)ethylene glycol (meth)acrylate, polybenzyl (meth)acrylate, and amorphous polyester are more preferable.

In the thermoelectric conversion layer 16 obtained by dispersing a thermoelectric conversion material in a resin material, a quantitative ratio between the resin material and the thermoelectric conversion material may be appropriately set according to the material used, the thermoelectric conversion efficiency required, the viscosity or solid content concentration of a solution exerting an influence on printing, and the like.

As another constitution of the thermoelectric conversion layer 16 in the thermoelectric conversion element 10 of the present invention, a thermoelectric conversion layer mainly consisting of CNT and a surfactant is also suitably used.

By constituting the thermoelectric conversion layer 16 with CNT and a surfactant, the thermoelectric conversion layer 16 can be formed using a coating composition to which a surfactant is added. Therefore, the thermoelectric conversion layer 16 can be formed using a coating composition in which CNT is excellently dispersed. As a result, by the thermoelectric conversion layer 16 containing a large amount of long and less defective CNT, an excellent thermoelectric conversion performance is obtained.

As the surfactant, known surfactants can be used as long as they function to disperse CNT. More specifically, various surfactants can be used as the surfactant as long as they dissolve in water, a polar solvent, or a mixture of water and a polar solvent and has a group adsorbing CNT.

Therefore, the surfactant may be ionic or nonionic. Furthermore, the ionic surfactant may be any of cationic, anionic, and amphoteric surfactants.

Examples of the anionic surfactant include an aromatic sulfonic acid-based surfactant such as alkylbenzene sulfonate like dodecylbenzene sulfonate or dodecylphenylether sulfonate, a monosoap-based anionic surfactant, an ether sulfate-based surfactant, a phosphate-based surfactant, a carboxylic acid-based surfactant such as sodium deoxycholate or sodium cholate, a water-soluble polymer such as carboxymethyl cellulose and a salt thereof (sodium salt, ammonium salt, or the like), a polystyrene sulfonate ammonium salt, or a polystyrene sulfonate sodium salt, and the like.

Examples of the cationic surfactant include an alkylamine salt, a quaternary ammonium salt, and the like. Examples of the amphoteric surfactant include an alkyl betaine-based surfactant, an amine oxide-based surfactant, and the like.

Examples of the nonionic surfactant include a sugar ester-based surfactant such as sorbitan fatty acid ester, a fatty acid ester-based surfactant such as polyoxyethylene fatty acid ester, an ether-based surfactant such as polyoxyethylene alkyl ether, and the like.

Among these, an ionic surfactant is preferably used, and cholate or deoxycholate is particularly suitably used.

In the thermoelectric conversion layer 16, a mass ratio of surfactant/CNT is preferably equal to or lower than 5, and more preferably equal to or lower than 3.

It is preferable that the mass ratio of surfactant/CNT is equal to or lower than 5, because then a higher thermoelectric conversion performance is obtained.

If necessary, the thermoelectric conversion layer 16 consisting of an organic material may contain an inorganic material such as $SiO_2$, $TiO_2$, $Al_2O_3$, or $ZrO_2$.

In a case where the thermoelectric conversion layer 16 contains an inorganic material, a content of the inorganic material is preferably equal to or less than 20% by mass, and more preferably equal to or less than 10% by mass.

In the thermoelectric conversion element 10 of the present invention, a thickness of the thermoelectric conversion layer 16, a size of the thermoelectric conversion layer 16 in the plane direction, a proportion of an area of the thermoelectric conversion layer 16 in the substrate along the plane direction, and the like may be appropriately set according to the material forming the thermoelectric conversion layer 16, the size of the thermoelectric conversion element 10, and the like.

In the thermoelectric conversion element 10 illustrated in the drawing, the thermoelectric conversion layer 16 is formed such that the center thereof in the plane direction is positioned in the border line between the high thermal conduction portion 12b and the low thermal conduction portion 12a of the first substrate 12.

The thermoelectric conversion layer 16 described above is connected to the electrodes 26 and 28 such that the thermoelectric conversion layer 16 is interposed between the electrodes in the plane direction. In the thermoelectric conversion element 10, the electrodes 26 and 28 are connected to the thermoelectric conversion layer 16 in a state of contacting the end face of the thermoelectric conversion layer 16.

In the present invention, the electrodes 26 and 28 are formed of a metal material having a negative Seebeck coefficient. Having a negative Seebeck coefficient means showing n-type properties in other words.

The thermoelectric conversion element 10 of the present invention is a thermoelectric conversion element in which a thermoelectric conversion layer is formed between substrates having a high thermal conduction portion and a low thermal conduction portion, the high thermal conduction portions of the two substrates are in different positions in a plane direction, and a temperature difference is caused in the plane direction of the thermoelectric conversion layer. In the following description, the thermoelectric conversion element having such a constitution will be referred to as a "in plane-type thermoelectric conversion element" as well.

In the present invention, in such an in plane-type thermoelectric conversion element, the thermoelectric conversion layer 16 having a positive Seebeck coefficient is combined with the electrodes 26 and 28 that use a metal material having a negative Seebeck coefficient. By adopting such a constitution, the present invention can perform thermoelectric conversion not only in the thermoelectric conversion layer 16 but also in the electrodes 26 and 28. Furthermore, the present invention can establish the same constitution as that of the π-type thermoelectric conversion element in which a p-type semiconductor and an n-type semiconductor are combined, and makes it possible to obtain an extremely excellent thermoelectric conversion performance.

The electrodes 26 and 28 can be formed of various materials as long as the materials have necessary conductivity and a negative Seebeck coefficient.

Specifically, examples of the materials include one or more materials among metallic materials such as Ni, a Ni alloy, Al, an Al alloy, and Pt and oxide semiconductors such as indium tin oxide (ITO), indium zinc oxide (IZO), aluminum-doped zinc oxide (AZO), and fluorine-doped tin oxide (FTO).

As the Ni alloy, it is possible to use various Ni alloys generating power by causing a temperature difference. Specific examples thereof include Ni alloys mixed with one or two or more components among vanadium (V), Cr, silicon (Si), Al, Ti, molybdenum (Mo), manganese (Mn), zinc (Zn), stannum (Sn), Cu, cobalt (Co), iron (Fe), magnesium (Mg), zirconium (Zr), and the like.

As the Al alloy, it is possible to use various Al alloys generating power by causing a temperature difference. Specific examples thereof include Al alloys mixed with one or two or more components among Cu, Mn, Si, Mg, Zn, Ni, and the like.

In the present invention, a Ni content in the electrodes 26 and 28 (electrode bodies 52a and 54a which will be described later) is preferably equal to or greater than 50 at %, and more preferably equal to or greater than 90 at %. It is particularly preferable that the electrodes 26 and 28 consist of Ni. In the present invention, consisting of Ni means consisting of Ni and unavoidable impurities.

It is preferable that the Ni content in the electrodes 26 and 28 is equal to or greater than 90 at %, because then an excellent thermoelectric conversion performance can be obtained by using a high Seebeck coefficient (an absolute value of a Seebeck coefficient) Ni has, the adhesiveness of the electrodes with respect to the substrates becomes high, and a thermoelectric conversion element (thermoelectric conversion module) having excellent flexibility can be obtained.

The thickness, size, and the like of the electrodes 26 and 28 may be appropriately set according to the thickness of the thermoelectric conversion layer 16, the size of the thermoelectric conversion element 10, and the like.

As described above, the electrodes 26 and 28 are provided such that the thermoelectric conversion layer 16 is interposed between them in the plane direction.

In a preferred constitution of the thermoelectric conversion element 10, the electrodes 26 and 28 are formed such that they contact the end face of the thermoelectric conversion layer 16 in the plane direction, cover the end face in the plane direction, and continue from the end face and reach the upper surface of the thermoelectric conversion layer 16 so as to cover the vicinity of the end of the upper surface. That is, the electrodes 26 and 28 are formed such that they rise from the surface of the adhesive layer 14, reach the upper surface of the thermoelectric conversion layer 16 from the end face of the thermoelectric conversion layer 16, and continue until they cover the vicinity of the end of the upper surface of the thermoelectric conversion layer 16.

If the aforementioned constitution is adopted, a contact area between the thermoelectric conversion layer 16 and the electrodes 26 and 28 increases. Accordingly, it is possible to improve the thermoelectric conversion performance by reducing the resistance in the interface. Herein, as long as a short circuit is not caused by the electrodes, the electrodes 26 and 28 may be formed such that they cover the upper surface of the thermoelectric conversion layer 16.

In the thermoelectric conversion element 10 of the present invention, the shape of the electrodes connected to the thermoelectric conversion layer 16 are not limited to the constitution covering a portion of the upper surface of the thermoelectric conversion layer 16 as illustrated in the drawing.

For example, as in the in plane-type thermoelectric conversion element described in JP3981738B, the electrodes may be constituted such that they contact only the end face of the thermoelectric conversion layer 16 in the plane direction, and the electrodes and the thermoelectric conversion layer 16 are electrically connected to each other.

The thermoelectric conversion element 10 has the oxide layer 18 that covers the thermoelectric conversion layer 16 and the electrodes 26 and 28.

The oxide layer 18 functions as a gas barrier layer. Accordingly, if the thermoelectric conversion element 10 has the oxide layer 18, it is possible to prevent the thermoelectric conversion layer 16 or the electrodes 26 and 28 from deteriorating due to moisture or the like passing through the second substrate 24 or the pressure sensitive adhesive layer 20. Furthermore, if the thermoelectric conversion element 10 has the oxide layer 18, it is possible to press down the thermoelectric conversion layer 16 and the electrodes 26 and 28 such that they reliably adhere to each other, and to prevent the thermoelectric conversion layer 16 and the electrodes 26 and 28 from being damaged at the time when the thermoelectric conversion element 10 (thermoelectric conversion module) is folded.

The oxide layer 18 can be formed of various inorganic oxides.

Examples of the oxide layer 18 suitably include films consisting of inorganic compounds like a metal oxide such as aluminum oxide, magnesium oxide, tantalum oxide, zirconium oxide, titanium oxide, or indium tin oxide; a silicon oxide such as silicon oxide, silicon oxynitride, silicon oxycarbide, or silicon oxynitrocarbide; a silicon nitride such as silicon nitride or silicon carbonitride; a mixture of two or more kinds of these; and a nitrogen-containing substance of these; and the like.

Particularly, silicon oxide, silicon oxynitride, aluminum oxide, and silicon nitride are suitably used because these can exhibit excellent gas barrier properties.

A thickness of the oxide layer 18 may be appropriately set according to the material forming the oxide layer 18, such that an intended gas barrier performance is obtained.

Specifically, the thickness is preferably 10 to 1,000 nm, and more preferably 50 to 200 nm.

The thickness of the oxide layer 18 is preferably equal to or greater than 10 nm and particularly preferably equal to or greater than 50 nm, because then excellent gas barrier properties are obtained.

Furthermore, the thickness of the oxide layer 18 is preferably equal to or less than 1,000 nm and particularly preferably equal to or less than 200 nm, because then the thermoelectric conversion element 10 (thermoelectric conversion module) can be made into a thin film, and the thermoelectric conversion element 10 having excellent flexibility can be obtained.

The pressure sensitive adhesive layer 20 is formed on the oxide layer 18. The pressure sensitive adhesive layer 20 is provided such that the second substrate 24 is bonded thereto with sufficient adhesion.

As a material forming the pressure sensitive adhesive layer 20, it is possible to use various materials that enable the oxide layer 18 and the second substrate 24 to be bonded to each other, according to the materials forming the oxide layer 18 and the second substrate 24 (low thermal conduction portion 24a). In a case where the thermoelectric conversion element 10 does not have the oxide layer 18, as the material forming the pressure sensitive adhesive layer 20, various materials that enable the electrodes, the thermoelectric conversion layer 16, and the second substrate 24 to adhere to each other may be used.

Specific examples of the materials include an acryl resin, a urethane resin, a silicone resin, an epoxy resin, rubber, EVA, α-olefin polyvinyl alcohol, polyvinyl butyral, polyvinyl pyrrolidone, gelatin, starch, and the like. Furthermore, the pressure sensitive adhesive layer 20 may be formed using commercially available double-sided tapes or pressure sensitive films.

A thickness of the pressure sensitive adhesive layer 20 may be appropriately set according to the material forming the pressure sensitive adhesive layer 20, a step height resulting from the thermoelectric conversion layer 16, and the like, such that the oxide layer 18 and the second substrate 24 can be bonded to each other with sufficient adhesion.

Specifically, the thickness is preferably 5 to 100 μm, and more preferably 5 to 50 μm.

It is preferable that the thickness of the pressure sensitive adhesive layer 20 is equal to or greater than 5 μm, because then the step resulting from the thermoelectric conversion layer 16 can be sufficiently buried, and excellent adhesiveness can be obtained.

Furthermore, the thickness of the pressure sensitive adhesive layer 20 is preferably equal to or less than 100 μm and particularly preferably equal to or less than 50 μm, because then the thermoelectric conversion element 10 (thermoelectric conversion module) can be made into a thin film, the thermoelectric conversion element 10 having excellent flexibility can be obtained, the heat resistance of the pressure sensitive adhesive layer 20 can be reduced, and a better thermoelectric conversion performance can be obtained.

If necessary, in order to improve the adhesiveness, in either or both of the interface between the oxide layer 18 and the pressure sensitive adhesive layer 20 and the interface between the pressure sensitive adhesive layer 20 and the second substrate 24, at least one surface forming the interface may be subjected to a known surface treatment such as a plasma treatment, a UV ozone treatment, or an electron beam irradiation treatment such that the surface is modified or cleaned.

In a state where a surface, which is totally occupied by the low thermal conduction portion 24a, of the second substrate 24 faces the pressure sensitive adhesive layer 20, the second substrate 24 is bonded onto the pressure sensitive adhesive layer 20, and in this way, the thermoelectric conversion element 10 is constituted.

In a state where the high thermal conduction portion 24b is in a direction that does not overlap the plane direction of the high thermal conduction portion 12b of the first substrate 12, and the boundary line between the low thermal conduction portion and the high thermal conduction portion coincides with the first substrate 12, the second substrate 24 is bonded to the pressure sensitive adhesive layer 20.

Accordingly, in the example illustrated in the drawing, the thermoelectric conversion layer 16 is provided such that the center thereof in the plane direction coincides with the boundary between the low thermal conduction portion and the high thermal conduction portion of the two substrates.

That is, in the thermoelectric conversion element 10 of the present invention, the first substrate 12 and the second substrate 24 have the high thermal conduction portion 12*b* and the high thermal conduction portion 24*b* respectively, and the high thermal conduction portion 12*b* and the high thermal conduction portion 24*b* do not overlap each other and are in different positions in the plane direction. Therefore, for example, if a heat source is provided on the first substrate 12 side, along the horizontal direction in FIGS. 1A to 1C, a temperature difference is caused between the high thermal conduction portion 12*b* and the high thermal conduction portion 24*b* in the plane direction of the thermoelectric conversion layer 16. That is, between the high thermal conduction portion 12*b* and the high thermal conduction portion 24*b*, heat flows in the plane direction of the thermoelectric conversion layer 16.

Accordingly, due to the temperature difference caused in a long distance along the plane direction (in plane), the thermoelectric conversion element 10 of the present invention can generate electric power with excellent efficiency.

Furthermore, the thermoelectric conversion element 10 of the present invention is an in plane-type thermoelectric conversion element in which the thermoelectric conversion layer 16 having a positive Seebeck coefficient is combined with the electrodes 26 and 28 using a metal material having a negative Seebeck coefficient, and a temperature difference is caused in the plane direction. As described above, from this element, a better thermoelectric conversion performance is obtained.

In the thermoelectric conversion element 10 illustrated in the drawing, the high thermal conduction portion 12*b* of the first substrate 12 and the high thermal conduction portion 24*b* of the second substrate 24 are in different positions in the plane direction along the direction in which the electrodes 26 and 28 (electrode pair (a pair of electrodes)) separate from each other, such that the high thermal conduction portion 12*b* and the high thermal conduction portion 24*b* contact each other in a state of facing each other in a direction along which electricity is conducted by the electrodes 26 and 28.

In addition to the aforementioned constitution, the thermoelectric conversion element of the present invention can adopt various constitutions, as long as the high thermal conduction portion of the first substrate and the high thermal conduction portion of the second substrate do not completely overlap each other in the plane direction. In other words, the thermoelectric conversion element of the present invention can adopt various constitutions, as long as the high thermal conduction portion of the first substrate and the high thermal conduction portion of the second substrate do not completely overlap each other when the high thermal conduction portions are seen in a direction orthogonal to the substrate surface.

For example, in the examples shown in FIGS. 1A to 1C, the high thermal conduction portion 12*b* of the first substrate 12 may be moved to the right side in the drawing, and the high thermal conduction portion 24*b* of the second substrate 24 may be moved to the left side in the drawing, such that the two high thermal conduction portions separate from each other in the plane direction along the direction in which the electrodes 26 and 28 separate from each other. Specifically, in the plane direction, the high thermal conduction portion 12*b* of the first substrate 12 and the high thermal conduction portion 24*b* of the second substrate 24 separate from each other preferably by 10% to 90% and more preferably by 10% to 50% in the direction along which the electrodes 26 and 28 separate from each other, with respect to the size of the thermoelectric conversion layer 16 in the direction along which the electrodes 26 and 28 separate from each other.

Alternatively, in the constitution in which the two high thermal conduction portions separate from each other, projection portions facing another direction may be provided in the high thermal conduction portion 12*b* and/or the high thermal conduction portion 24*b*, such that the high thermal conduction portions of the two substrates partially overlap each other in the plane direction.

Inversely, in the example illustrated in FIGS. 1A to 1C, the high thermal conduction portion 12*b* of the first substrate 12 may be moved to the left side in the drawing, and the high thermal conduction portion 24*b* of the second substrate 24 may be moved to the right side in the drawing, such that the high thermal conduction portions of the two substrates overlap each other in the plane direction.

In the present invention, in addition to the aforementioned constitution, various constitutions can be adopted, as long as the high thermal conduction portion of the first substrate and the high thermal conduction portion of the second substrate do not completely overlap each other in the plane direction.

For example, a circular high thermal conduction portion may be formed on the first substrate, a square-like high thermal conduction portion having the same size as the circular high thermal conduction portion (the length of one side of the square is equal to the diameter of the circle) may be formed on the second substrate, and the two substrates are disposed such that the centers of the two high thermal conduction portions coincide with each other in the plane direction. In this constitution, although the distance between the two high thermal conduction portions is short, the end (peripheral) positions thereof are different in the plane direction. Therefore, in the thermoelectric conversion layer, a temperature difference is caused in the plane direction, and accordingly, electric power can be more efficiently generated in this element than in a thermoelectric conversion element in which a temperature difference is caused in a thickness direction.

Figure 2:
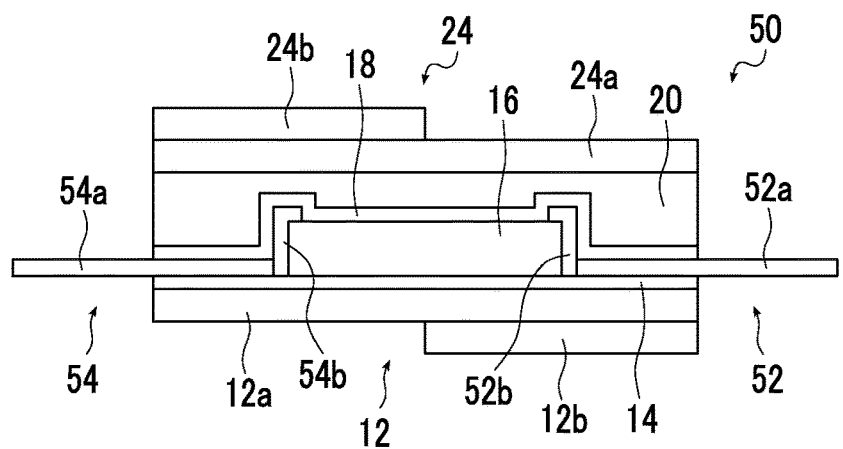
FIG. 2 is a front view schematically showing another example of the thermoelectric conversion element of the present invention.

FIG. 2 schematically shows another example of the thermoelectric conversion element of the present invention.

FIG. 2 is a front view just like FIG. 1B described above. The constitution of a thermoelectric conversion element 50 shown in FIG. 2 is basically the same as the constitution of the thermoelectric conversion element 10 shown in FIG. 1B and the like, except that electrodes 52 and 54 have a different constitution. Therefore, the same members will be marked with the same references, and the following description will be mainly focused on the different sites.

In the thermoelectric conversion element 10 shown in FIG. 1B and the like, the electrodes 26 and 28 are formed of a metal material having a negative Seebeck coefficient.

In contrast, in the thermoelectric conversion element 50 shown in FIG. 2, the electrode 52 is constituted with an electrode body 52*a* and a connection portion 52*b*. Furthermore, the electrode 54 is constituted with an electrode body 54*a* and a connection portion 54*b*.

In the thermoelectric conversion element 50 shown in FIG. 2, the electrodes 52 and 54 are different from each other only in terms of the direction thereof or the position in which they are connected to the thermoelectric conversion layer 16. Therefore, hereinafter, the electrode 52 will be described as a typical example.

In the electrode 52 (electrode 54), the electrode body 52*a* (electrode body 54*a*) is formed of a metal material having a negative Seebeck coefficient just like the aforementioned electrode 26 and the like. In contrast, the connection portion

52b (connection portion 54b) is formed of a metal material having conductivity higher than that of the electrode body 52a.

In the electrode 52, the connection portion 52b is connected to the thermoelectric conversion layer 16, and the electrode body 52a is connected to the connection portion 52b. That is, the connection portion 52b having high conductivity is provided between the electrode body 52a having a negative Seebeck coefficient and the thermoelectric conversion layer 16, and the electrode body 52a and the thermoelectric conversion layer 16 are electrically connected to each other.

At this time, the electrode body 52a may also contact the thermoelectric conversion layer 16.

In other words, in the electrode 26 that is directly connected to the thermoelectric conversion layer 16, a connection portion may also be used in combination. An example of this constitution will be shown later in FIG. 3C.

If the aforementioned constitution is adopted, it is possible to reduce the interface resistance between the electrode 52 and the thermoelectric conversion layer 16 and to obtain a better thermoelectric conversion performance.

Only one of the electrodes constituting the electrode pair may have the aforementioned connection portion. However, it is preferable to adopt a constitution in which both of the electrodes have the connection portion.

In the example shown in FIG. 2, the connection portion 52b just contacts the end of the electrode body 52a while it covers the vicinity of the end of the upper surface of the thermoelectric conversion layer 16. However, a constitution may be adopted in which the connection portion 52b also covers the upper surface of the vicinity of the end of the electrode body 52a. Such a constitution can be established by forming the thermoelectric conversion layer 16 and the electrode body 52a and then forming the connection portion 52b.

Various metal materials can be used as a material for forming the connection portion 52b, as long as the materials have conductivity higher than that of the material forming the electrode body 52a.

Examples of the materials include Cu, Ag, Au, Pt, and the like. A thickness of the connection portion 52b may be appropriately set according to the material forming the connection portion 52b. Specifically, the thickness of the connection portion 52b is preferably 0.05 to 5 µm, and more preferably 0.2 to 2 µm.

In a case where an electrode is constituted with an electrode body and a connection portion just like the electrode 52, it is preferable that a buffer layer consisting of an electron-donating material or an electron-accepting material is disposed between the connection portion and the thermoelectric conversion layer 16. The buffer layer may be provided in accordance with any one of the electrodes 26 and 28, but it is preferable that the buffer layer is provided in accordance with both of the electrodes.

It is preferable to provide such a buffer layer, because then the resistance in the electrode interface can be reduced, and hence a better thermoelectric conversion performance can be obtained.

As the buffer layer, various electron-donating organic materials can be used.

Specific examples thereof include low-molecular weight materials like an aromatic diamine compound such as N,N'-bis(3-methylphenyl)-(1,1'-biphenyl)-4,4'-diamine (TPD) or 4,4'-bis[N-(naphthyl)-N-phenyl-amino]biphenyl (α-NPD), oxazole, oxadiazole, triazole, imidazole, imidazolone, a stilbene derivative, a pyrazoline derivative, tetrahydroimidazole, polyaryl alkane, butadiene, 4,4',4"tris(N-(3-methylphenyl)N-phenylamino)triphenylamine (m-MTDATA), a porphyrin compound such as porphyrin, tetraphenyl porphyrin Cu, phthalocyanine, Cu phthalocyanine, or titanium phthalocyanine oxide, a triazole derivative, an oxadiazole derivative, an imidazole derivative, a polyaryl alkane derivative, a pyrazoline derivative, a pyrazolone derivative, a phenylene diamine derivative, an aryl amine derivative, an amino-substituted chalcone derivative, an oxazole derivative, a styryl anthracene derivative, a fluorenone derivative, a hydrazone derivative, a silazane derivative, and the like.

Examples of the electron-donating organic materials include polymer materials like polymers such as phenylene vinylene, fluorene, carbazole, indole, pyrene, pyrrole, picoline, thiophene, acetylene, and diacetylene or derivatives thereof.

As the buffer layer, a compound having sufficient hole transport properties can be used even if the compound is not an electron-donating compound.

Specifically, examples of such a compound include the compounds described in paragraphs "0083" to "0089" of JP2008-72090A, paragraphs "0043" to "0063" of JP2011-176259A, paragraphs "0121" to "0148" of JP2011-228614A, paragraphs "0108" to "0156" of JP2011-228615A, and the like.

In addition, as the buffer layer, various electron-donating inorganic materials can be used.

Examples of the electron-donating inorganic materials include calcium oxide, chromium oxide, chromium copper oxide, manganese oxide, cobalt oxide, nickel oxide, copper oxide, gallium copper oxide, strontium copper oxide, niobium oxide, molybdenum oxide, indium copper oxide, indium silver oxide, iridium oxide, and the like.

As the buffer layer, an electron-accepting organic material may be used.

Examples of the electron-accepting material include an oxadiazole derivative such as 1,3-bis(4-tert-butylphenyl-1,3,4-oxadiazolyl)phenylene (OXD-7), a tetracyanoquinodimethane (TCNQ) derivative, an anthraquinodimethane derivative, a diphenylquinone derivative, bathocuproine, bathophenanthroline, derivatives of these, a triazole compound, a tris(8-hydroxyquinolinato)aluminum complex, bis (4-methyl-8-quinolinato)aluminum complex, a distyrylarylene derivative, a silole compound, and the like.

Furthermore, a material having sufficient electron transport properties can be used even if the material is not an electron-accepting organic material. It is possible to use a porphyrin-based compound, a styryl-based compound such as 4-dicyanomethylene-2-methyl-6-(4-(dimethylaminostyryl))-4H pyran (DCM), and a 4H pyran-based compound. Specific examples thereof include the compounds described in paragraphs "0073" to "0078" of JP2008-72090A and the like.

A thickness of the buffer layer may be appropriately set according to the material forming the buffer layer, such that sufficient effects are obtained. The thickness of the buffer layer is preferably 0.05 to 100 nm, and more preferably 0.5 to 10 nm. The thickness of the buffer layer means a thickness of the buffer layer between the thermoelectric conversion layer and the electrode.

In the example shown in FIGS. 1A to 1C and FIG. 2, the thermoelectric conversion layer 16 is a rectangular plate-like substance (rectangular parallelepiped). However, in the thermoelectric conversion element of the present invention, thermoelectric conversion layers having various shapes can be used.

Figure 3A:
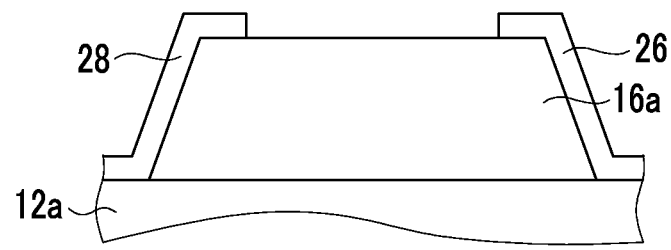
FIGS. 3A to 3C are views schematically showing another example of a thermoelectric conversion layer of the thermoelectric conversion element of the present invention.

For example, as schematically shown in FIG. 3A, a thermoelectric conversion layer 16a having a square pyramid shape may be used. Alternatively, the thermoelectric conversion layer may have a cylindrical shape, a prism shape other than a square prism shape, a truncated cone shape, a truncated pyramid shape, an indeterminate form, and the like.

In the thermoelectric conversion element of the present invention, the thermoelectric conversion layer preferably has such a shape that an end face thereof in the plane direction is tapered just like the square pyramid shape of the thermoelectric conversion layer 16a shown in FIG. 3A or a truncated cone shape. That is, the end face of the thermoelectric conversion layer in the plane direction preferably slants toward the center of the thermoelectric conversion layer.

By tapering the end face in the plane direction just like the thermoelectric conversion layer 16a shown in FIG. 3A, a contact area between the thermoelectric conversion layer 16a and the electrodes 26 and 28 can be increased. As a result, the resistance in the interface between the thermoelectric conversion layer 16a and the electrodes 26 and 28 can be reduced, and hence a better thermoelectric conversion performance can be obtained.

Figure 4A:
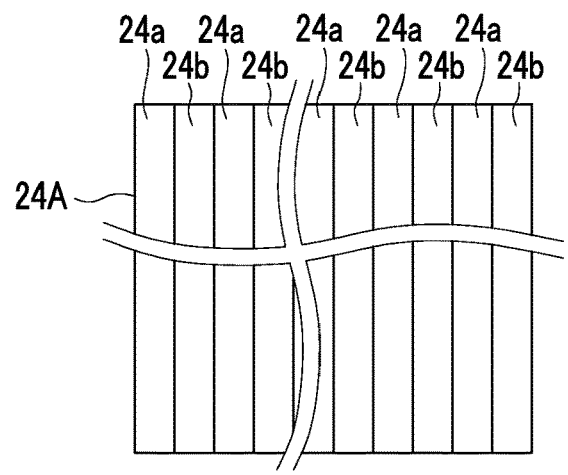
FIGS. 4A to 4D are schematic views for illustrating an example of a thermoelectric conversion module of the present invention using the thermoelectric conversion element of the present invention.
Figure 4B:
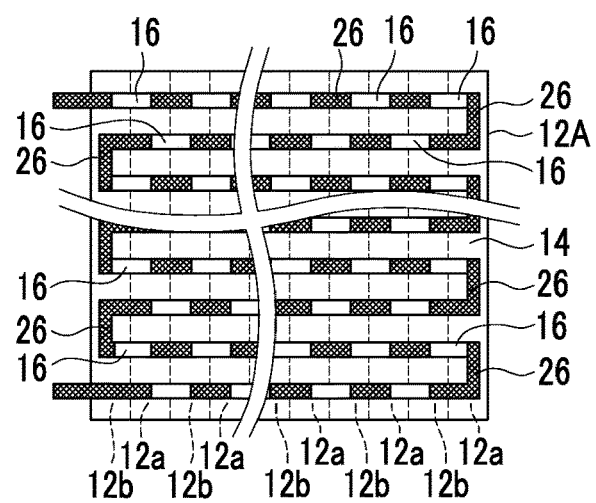
Figure 4C:
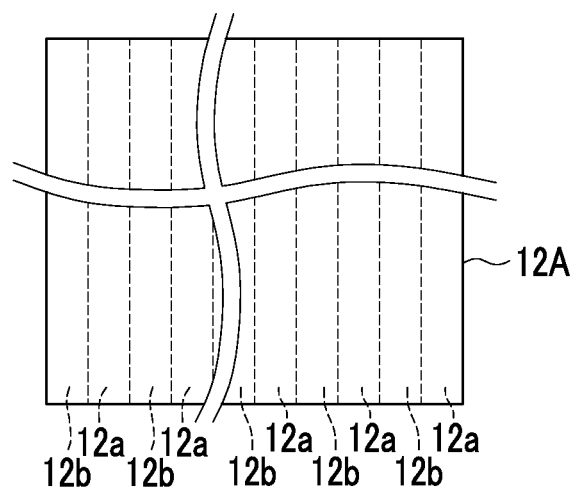
Figure 4D:
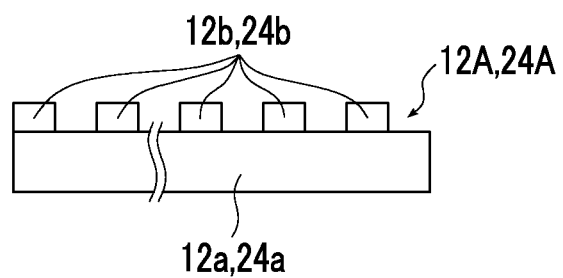

FIGS. 4A to 4D show an example of the thermoelectric conversion module of the present invention that is obtained by connecting a plurality of the thermoelectric conversion elements 10 of the present invention in series. FIGS. 4A to 4C are top views, and FIG. 4D is a front view.

In the example, a first substrate 12A and a second substrate 24A have a constitution in which on the surface of a rectangular plate-like low thermal conduction material, square prism-like high thermal conduction portions extending in one direction are arranged at an interval, which equals to the length of one side of the square prism contacting low thermal conduction portions, in a direction orthogonal to the extension direction of the square prisms.

That is, the first substrate 12A and the second substrate 24A have a constitution in which the entirety of one surface of the substrates is occupied by a low thermal conduction portion, and the other surface thereof is occupied by low thermal conduction portions and high thermal conduction portions which extend in one direction and are arranged at an equal interval in a direction orthogonal to the extension direction (see FIGS. 4A, 4C, and 4D).

Figure 5B:
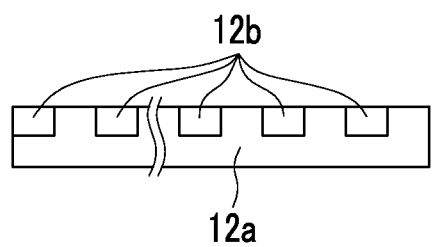

In the present example, the first substrate (second substrate) can also adopt various constitutions other than the constitution in which the high thermal conduction portions are disposed on the surface of the low thermal conduction portion. For example, as schematically shown in FIG. 5B, the first substrate may have a constitution in which in a rectangular plate-like low thermal conduction material, grooves extending in one direction (direction orthogonal to the paper surface of FIG. 5B) are formed in a direction orthogonal to the extension direction at an interval which equals to the width of the grooves, and a high thermal conduction material is incorporated into the grooves.

As schematically shown in FIGS. 4B and 4C, the thermoelectric conversion layer 16 has a rectangular surface shape and is formed on a surface, which is totally occupied by the low thermal conduction portion 12a, of the first substrate 12A in a state where the center of the thermoelectric conversion layer 16 coincides with the boundary between the low thermal conduction portion 12a and the high thermal conduction portion 12b in the plane direction. That is, the thermoelectric conversion layer 16 is formed on the upper surface of the first substrate 12A that is in a state created when FIG. 4D is upside down along the vertical direction in the drawing.

In the example illustrated in the drawing, the size of the thermoelectric conversion layer 16 in the horizontal direction in FIG. 4B is the same as the width of the high thermal conduction portion 12b. In other words, the horizontal direction in FIG. 4B is a direction in which the low thermal conduction portion 12a and the high thermal conduction portion 12b are alternately arranged. In the following description, the horizontal direction in FIG. 4B will be simply referred to as a "horizontal direction" as well.

The thermoelectric conversion layers 16 are formed in the horizontal direction at an equal interval on every other boundary between the low thermal conduction portion 12a and the high thermal conduction portion 12b. That is, the thermoelectric conversion layers 16 are formed at an equal interval that is the same as the width of the high thermal conduction portion 12b. The width of the high thermal conduction portion 12b is the size of each thermoelectric conversion layer 16.

Furthermore, the thermoelectric conversion layers 16 are two-dimensionally formed, such that lines of the thermoelectric conversion layers 16 arranged at an equal interval in the horizontal direction are arranged at an equal interval in a vertical direction in FIG. 4B. In other words, the vertical direction in FIG. 4B is the extension direction of the low thermal conduction portion 12a and the high thermal conduction portion 12b. In the following description, the vertical direction in FIG. 4B will be simply referred to as a "vertical direction" as well.

In addition, as shown in FIG. 4B, within the arrays of the thermoelectric conversion layers 16 in the horizontal direction, the lines adjacent to each other in the vertical direction are formed such that they deviate from each other in the horizontal direction by the width of the high thermal conduction portion 12b. That is, in the lines adjacent to each other in the vertical direction, the thermoelectric conversion layers 16 are formed such that they alternate with each other by the width of the high thermal conduction portion 12b.

On the entire surface, on which the thermoelectric conversion layers 16 are formed, of the first substrate 12A, the adhesive layer 14 is formed.

The thermoelectric conversion layers 16 are connected to each other in series through the electrode 26 (electrode 28). Specifically, as shown in FIG. 4B, in the arrays of the thermoelectric conversion layers 16 in the horizontal direction in the drawing, the electrodes 26 are provided such that each of the thermoelectric conversion layers 16 is interposed therebetween in the horizontal direction. As a result, the thermoelectric conversion layers 16 arranged in the horizontal direction are connected to each other in series through the electrodes 26. In FIG. 4B, in order to clearly show the constitution, the electrodes 26 are shaded.

Furthermore, at the end of the thermoelectric conversion layers 16 in the horizontal direction, the thermoelectric conversion layers 16 in lines adjacent to each other in the vertical direction are connected to each other through the electrode 26. When the thermoelectric conversion layers 16 are connected to each other in the vertical direction through the electrode 26 at the end of the line in the horizontal direction, the thermoelectric conversion layer 16 at one end is connected to the thermoelectric conversion layer 16 at the end of an upper line that is on the same side as the one end, and the thermoelectric conversion layer 16 at the other end is connected to the thermoelectric conversion layer 16 at the end of a lower line that is on the same side as the other end.

As a result, all of the thermoelectric conversion layers 16 are connected to each other in series in the horizontal direction such that they look like a single line that is folded plural times.

As schematically shown in FIG. 4A, in a state where the surface, which is totally occupied by the low thermal conduction portion 24a, of the second substrate 24A faces down, and the boundary between the low thermal conduction portion 12a and the high thermal conduction portion 12b coincides with the first substrate 12A, the second substrate 24A is laminated on the thermoelectric conversion layers 16 and the electrodes 26. The second substrate 24A is laminated such that the high thermal conduction portion 12b of the first substrate 12A and the high thermal conduction portion 24b of the second substrate 24A alternate with each other.

Herein, before the second substrate 24A is laminated, the oxide layer 18 and the pressure sensitive adhesive layer 20 are formed on the thermoelectric conversion layers 16 and the electrodes 26 such that the first substrate 12A is totally covered, though the process is not illustrated in the drawing.

Accordingly, the low thermal conduction portions 12a of the first substrate 12A and regions, which are totally occupied by the high thermal conduction portions 24b, of the second substrate 24A face each other in a state of coinciding with each other in the plane direction, and the high thermal conduction portions 12b of the first substrate 12A and regions, which are totally occupied by the low thermal conduction portions 24a, of the second substrate 24A face each other in a state of coinciding with each other in the plane direction.

In this way, a thermoelectric conversion module in which a large number of thermoelectric conversion elements 10 of the present invention are connected to each other in series is constituted.

At the time of bonding the thermoelectric conversion module (thermoelectric conversion element) of the present invention to a heat source and generating power, a thermally conductive adhesive sheet or a thermal conductive adhesive may be used.

The thermally conductive adhesive sheet and the thermally conductive adhesive used by being bonded to a heating side or a cooling side of the thermoelectric conversion module are not particularly limited. Accordingly, commercially available thermally conductive adhesive sheets or thermally conductive adhesives can be used. As the thermally conductive adhesive sheet, for example, it is possible to use TC-50TXS2 manufactured by Shin-Etsu Silicone, a hyper soft heat dissipating material 5580H manufactured by Sumitomo 3M, Ltd., BFG20A manufactured by Denka Company Limited., TR5912F manufactured by NITTO DENKO CORPORATION, and the like. From the viewpoint of heat resistance, a thermally conductive adhesive sheet consisting of a silicone-based pressure sensitive adhesive is preferable. As the thermally conductive adhesive, for example, it is possible to use SCOTCH-WELD EW2070 manufactured by 3M, TA-01 manufactured by Ainex Co., Ltd., TCA-4105, TCA-4210, and HY-910 manufactured by Shiima Electronics, Inc., SST2-RSMZ, SST2-RSCSZ, R3CSZ, and R3MZ manufactured by SATSUMASOKEN CO., LTD., and the like.

The use of the thermally conductive adhesive sheet or the thermally conductive adhesive brings about an effect of increasing a surface temperature of the heating side of the thermoelectric conversion module by improving the adhesiveness with respect to the heat source, an effect of being able to reduce a surface temperature of the cooling side of the thermoelectric conversion module by improving the cooling efficiency, and the like, and accordingly, a power generation capacity can be improved.

On the surface of the cooling side of the thermoelectric conversion module, a heat dissipating fin (heatsink) or a heat dissipating sheet consisting of a known material such as stainless steel, copper, or aluminum may be provided. It is preferable to use the heat dissipating fin, because then a low-temperature side of the thermoelectric conversion module can be more suitably cooled, a big temperature difference is caused between the heat source side and the cooling side, and the thermoelectric conversion efficiency is further improved.

As the heat dissipating fin, it is possible to use various known fins such as T-Wing manufactured by TAIYO WIRE CLOTH CO., LTD, FLEXCOOL manufactured by SHI-GYOSOZO KENKYUSHO, a corrugated fin, an offset fin, a waving fin, a slit fin, and a folding fin. Particularly, it is preferable to use a folding fin having a fin height.

The heat dissipating fin preferably has a fin height of 10 to 56 mm, a fin pitch of 2 to 10 mm, and a plate thickness of 0.1 to 0.5 mm. The fin height is more preferably equal to or greater than 25 mm, because then the heat dissipating characteristics are improved, the module can be cooled, and hence the power generation capacity is improved. It is preferable to use a heat dissipating fin made of aluminum having a plate thickness of 0.1 to 0.3 mm, because such a fin is highly flexible and lightweight.

As the heat dissipating sheet, it is possible to use known heat dissipating sheets such as a PSG graphite sheet manufactured by Panasonic Corporation, COOL STAFF manufactured by Oki Electric Cable Co., Ltd., and CERAC a manufactured by CERAMISSION CO., LTD.

Hereinafter, an example of a method for manufacturing the thermoelectric conversion element 10 shown in FIGS. 1A to 1C will be described. Basically, the thermoelectric conversion module shown in FIGS. 4A to 4D can be manufactured in the same manner.

First, in an organic material that will become a resin material, a thermoelectric conversion material such as CNT is dispersed, thereby preparing a coating composition that will become the thermoelectric conversion layer 16. Alternatively, CNT and a surfactant are added to water and dispersed (dissolved), thereby preparing a coating composition.

Meanwhile, the first substrate 12 (12A) having the low thermal conduction portion 12a and the high thermal conduction portion 12b and the second substrate 24 (24A) having the low thermal conduction portion 24a and the high thermal conduction portion 24b are prepared.

For example, regarding the first substrate 12 (second substrate 24), by bonding a sheet-like (or belt-like) high thermal conduction portion 12b to a sheet-like substance that will become the low thermal conduction portion 12a, the first substrate 12 in which the high thermal conduction portion 12b is laminated on the low thermal conduction portion 12a may be prepared. Alternatively, by preparing a sheet-like substance, which is obtained by forming a layer to be the high thermal conduction portion 12b on the entire surface of a sheet-like substance to be the low thermal conduction portion 12a, and removing an unnecessary portion by performing etching on the layer to be the high thermal conduction portion 12b, the first substrate 12 in which the high thermal conduction portion 12b is laminated on the low thermal conduction portion 12a may be prepared.

On a surface, on which the high thermal conduction portion 12b is not formed, of the first substrate 12, that is, on a surface totally occupied by the low thermal conduction portion 12a, the adhesive layer 14 is formed.

The adhesive layer 14 may be formed by a known method according to the material forming the adhesive layer 14. For example, in a case where the adhesive layer 14 consists of silicon oxide, the adhesive layer 14 may be formed by an Electron Beam (EB) vapor deposition method or sputtering.

Then, the surface of the adhesive layer 14 is coated with the prepared coating composition that will become the thermoelectric conversion layer 16 by performing patterning according to the thermoelectric conversion layer 16 to be formed. The adhesive layer 14 may be coated with the coating composition by a known method such as a method using a mask or a printing method.

After the adhesive layer 14 is coated with the coating composition, the coating composition is dried by a method according to the resin material, thereby forming the thermoelectric conversion layer 16. If necessary, after being dried, the coating composition (resin material) may be cured by being irradiated with ultraviolet rays or the like.

Alternatively, the entire surface, on which the high thermal conduction portion 12b is not formed, of the first substrate 12 is coated with the prepared coating composition to be the thermoelectric conversion layer 16 and then dried, and then the thermoelectric conversion layer 16 may be formed as a pattern by etching or the like.

In a case where the thermoelectric conversion layer 16 is formed using a coating composition obtained by adding CNT and a surfactant to water and dispersing (dissolving) them, it is preferable to form the thermoelectric conversion layer 16 by means of forming the thermoelectric conversion layer by using the coating composition and then impregnating the thermoelectric conversion layer with a solvent dissolving the surfactant or by means of washing the thermoelectric conversion layer with a solvent dissolving the surfactant and then drying the thermoelectric conversion layer. In this way, the surfactant is removed from the thermoelectric conversion layer 16, and as a result, the thermoelectric conversion layer 16 in which a mass ratio of surfactant/CNT is extremely low more preferably which is free of a surfactant can be formed.

In the present invention, it is preferable to form the thermoelectric conversion layer 16 as a pattern by printing.

By forming the thermoelectric conversion layer as a pattern by printing, the thermoelectric conversion layer 16a in which the end face thereof in the plane direction is tapered as shown in FIG. 3A can be suitably formed in a simple manner.

As the printing method, it is possible to use various known printing methods such as screen printing and metal mask printing. In a case where the thermoelectric conversion layer is formed as a pattern by using a CNT-containing coating composition, it is more preferable to use metal mask printing. The printing conditions may be appropriately set according to the physical properties (solid content concentration, viscosity, viscoelastic properties, and the like) of the coating composition used, the opening size of a printing plate, the number of openings, the opening shape, a printing area, and the like. More specifically, an attack angle of a squeegee is preferably equal to or less than 50°, more preferably equal to or less than 40°, and particularly preferably equal to or less than 30°. As the squeegee, it is possible to use an obliquely polished squeegee, a sword squeegee, a square squeegee, a flat squeegee, a metal squeegee, and the like. The squeegee direction (printing direction) is preferably the same as the direction in which the thermoelectric conversion elements are connected to each other in series. A clearance is preferably 0.1 to 3.0 mm, and more preferably 0.5 to 2.0 mm. The printing can be performed at a printing pressure of 0.1 to 0.5 Mpa in a squeegee indentation amount of 0.1 to 3 mm. By performing printing under such conditions, a CNT-containing thermoelectric conversion layer pattern having a pitch of equal to or less than 1 mm and a film thickness of equal to or greater than 1 µm can be suitably formed, and the output of the thermoelectric conversion module can be improved.

Next, the electrodes 26 and 28 are formed such that the thermoelectric conversion layer 16 is interposed therebetween in the plane direction.

The electrodes 26 and 28 may be formed by a known method such as a vacuum vapor deposition method using a metal mask, according to the material forming the electrodes 26 and 28 and the like.

After the thermoelectric conversion layer 16 and the electrodes 26 and 28 are formed, the oxide layer 18 is formed. The oxide layer 18 may also be formed by a known method. For example, in a case where the oxide layer 18 consists of silicon oxide, the oxide layer 18 may be formed by an EB vapor deposition method or sputtering as described above.

Then, the pressure sensitive adhesive layer 20 is formed on the oxide layer 18. The pressure sensitive adhesive layer 20 may also be formed by a known method such as a coating method according to the material forming the pressure sensitive adhesive layer. Alternatively, the pressure sensitive adhesive layer 20 may be formed using a double-sided pressure sensitive adhesive tape.

Thereafter, the prepared second substrate 24 is bonded to the pressure sensitive adhesive layer 20, in a state where the surface, on which the high thermal conduction portion 24b is not formed, of the second substrate 24 faces the pressure sensitive adhesive layer 20, thereby preparing the thermoelectric conversion element 10.

In the aforementioned example, the electrodes 26 and 28 are formed after the thermoelectric conversion layer 16 is formed, but the thermoelectric conversion layer 16 and the electrodes 26 and 28 may be formed in reverse order.

Figure 3B:
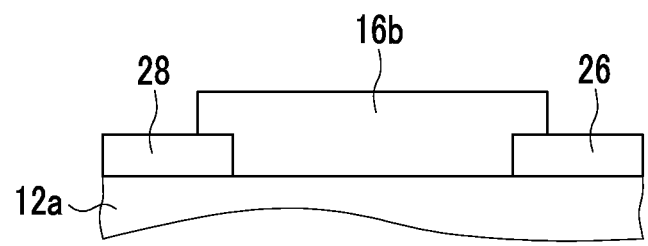

In this case, as in the constitution of the thermoelectric conversion layer 16b schematically shown in FIG. 3B, the end of the thermoelectric conversion layer may cover the ends of the electrodes 26 and 28.

In the constitution shown in FIG. 3B, a connection portion formed of a metal material having conductivity higher than that of the aforementioned electrode body may be used in combination.

Figure 3C:
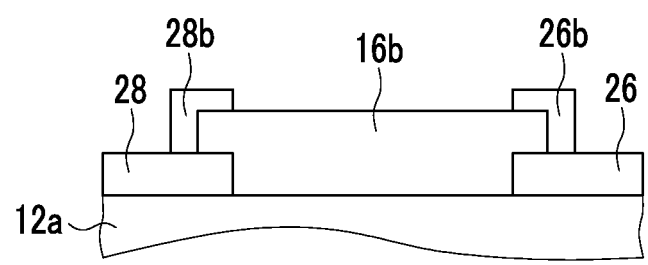

That is, as schematically shown in FIG. 3C, in addition to the electrodes 26 and 28 connected to the thermoelectric conversion layer 16b, a connection portion 26b connecting the thermoelectric conversion layer 16b to the electrode 26 and a connection portion 28b connecting the thermoelectric conversion layer 16b to the electrode 28 may be formed. It is preferable to adopt the constitution shown in FIG. 3C in which the connection portion 26b reaches not only the end face of the thermoelectric conversion layer 16b but also the upper surface thereof.

In this way, the electrode 26 is directly connected to the thermoelectric conversion layer 16b, and the electrode 26 is connected to the thermoelectric conversion layer 16b through the connection portion 26b. As a result, the resistance between the electrodes and the thermoelectric conversion layer can be reduced, the thermoelectric conversion performance can be improved, and the power generation capacity can be increased.

This constitution provided with the electrode directly connected to the thermoelectric conversion layer and the connection portion connecting the electrode with the thermoelectric conversion layer can also be used in the constitution shown in FIG. 1B in which the electrode 26 reaches the upper surface of the thermoelectric conversion layer 16 from the end face thereof or in the constitution in which the electrode just contacts the end face of the thermoelectric conversion layer.

The thermoelectric conversion element and the thermoelectric conversion module of the present invention described above can be used for various purposes.

For example, they can be used for electric power generation in various ways, such as power generators including a hot spring heat power generator, a solar power generator, and a waste heat power generator or power sources of various devices including a power source for a wristwatch, a power source for driving a semiconductor, and a power source for a small sensor. Furthermore, the thermoelectric conversion element of the present invention can also be used not only for electric power generation but also for a sensor element such as a thermal sensor or a thermocouple.

Hitherto, the thermoelectric conversion element and the thermoelectric conversion module of the present invention as well as the manufacturing methods thereof have been specifically described, but the present invention is not limited to the examples described above. It goes without saying that the present invention may be ameliorated or modified in various ways within a scope that does not depart from the gist of the present invention.

EXAMPLES

Hereinafter, the thermoelectric conversion element and the thermoelectric conversion module of the present invention will be more specifically described by illustrating specific examples of the present invention. However, the present invention is not limited to the following examples.

[Preparation of Coating Composition a that Will be Thermoelectric Conversion Layer]

EC (manufactured by Meijo Nano Carbon., average length of CNT: equal to or greater than 1 μm) as single-layer CNT and a resin represented by the following formula were added to 20 ml of o-dichlorobenzene such that a mass ratio of CNT/resin component became 25/75, thereby preparing a solution.

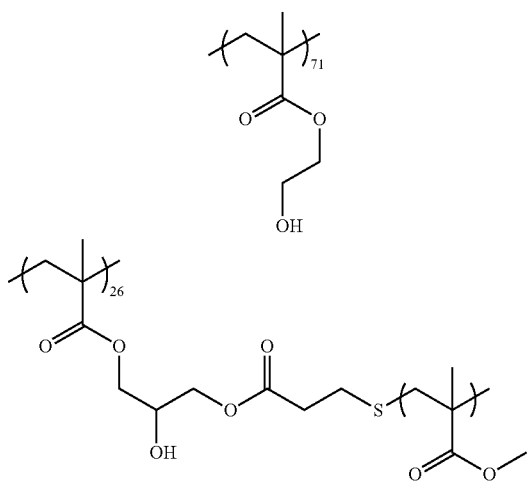

This solution was mixed for 15 minutes at 20° C. by using a mechanical homogenizer (manufactured by SMT Corporation, HIGH-FLEX HOMOGENIZER HF93), thereby obtaining a premix.

By using a thin film spin system high-speed mixer "FIL-MIX 40-40 model" (manufactured by PRIMIX Corporation), a dispersion treatment was performed on the obtained premix for 5 minutes at a circumferential speed of 40 m/sec in a constant-temperature tank with a temperature of 10° C. by a high-speed spinning thin film dispersion method, thereby preparing a coating composition A that will become the thermoelectric conversion layer 16.

<Measurement of Electric Conductivity and Seebeck Coefficient>

A plastic film having a thickness of 25 μm was coated with the coating composition A, followed by drying, thereby forming a thermoelectric conversion layer having a thickness of 10 μm.

A Seebeck coefficient S of the thermoelectric conversion layer was measured. As a result, the Seebeck coefficient was found to be 52 [μV/K].

Example 1-1

An adhesive-free copper-clad polyimide substrate (FE-LIOS R-F775, manufactured by Panasonic Electric Works Co., Ltd.) was prepared. The copper-clad polyimide substrate had a size of 80×80 mm, a thickness of a polyimide layer was 20 μm, and a thickness of a Cu layer was 70 μm.

By etching the copper layer of the copper-clad polyimide substrate, copper stripe patterns having a width of 1 mm and an interval of 1 mm were formed. In this way, the first substrate 12A and the second substrate 24A were prepared in each of which belt-like high thermal conduction portions having a thickness of 70 μm and a width of 1 mm were arranged at an interval of 1 mm in a direction orthogonal to the extension direction of the belt on the surface of sheet-like low thermal conduction portion having a thickness of 20 μm.

By using the coating composition A prepared as above, on a surface (planar surface), which was totally occupied by the polyimide layer, of the first substrate 12A, 885 of 1×1 mm patterns of the coating composition A were formed at an interval of 1 mm in the extension direction of the high thermal conduction portion and an interval of 1 mm in the arrangement direction of the high thermal conduction portion, followed by drying. The patterns of the coating composition A were formed by screen printing.

The formation and drying of the patterns were performed three times, thereby forming 885 thermoelectric conversion layers 16 having a thickness of 4.5 μm.

The 1×1 mm patterns of the thermoelectric conversion layer 16 were formed such that, as shown in FIG. 4B, the center of each thermoelectric conversion layer 16 in the plane direction coincided with the boundary between the low thermal conduction portion 12a and the high thermal conduction portion 12b, and the thermoelectric conversion layers 16 were formed in alternate positions in the upper and lower lines.

Furthermore, the formed thermoelectric conversion layer 16 has an approximately square pyramid shape which had a lower surface with a size of 1×1 mm and an upper surface with a size of 0.8×0.8 mm and in which the end in the plane direction was tapered as shown in FIG. 3A. The lower surface of the thermoelectric conversion layer 16 is the surface on the first substrate side.

Then, by a vacuum vapor deposition method using a metal mask, the electrode 26 (electrode 28) having a thickness of 1 μm consisting of Ni (Seebeck coefficient: −15.4 μV/K) was formed and connected in series to the 885 thermoelectric conversion layers as shown in FIG. 4B.

The electrode 26 was formed such that it covered the tapered end face of the thermoelectric conversion layer 16 and the upper surface of the thermoelectric conversion layer 16 by 0.1 μm as shown in FIG. 3A.

Next, as the pressure sensitive adhesive layer 20, a double-sided tape (manufactured by NITTO DENKO CORPORATION, double-sided tape No. 5603, acrylic) having a thickness of 30 μm was bonded such that the entirety of the surface, on which the thermoelectric conversion layer 16 and the electrode 26 were formed, of the first substrate 12A was covered.

Furthermore, the second substrate 24A was bonded onto the pressure sensitive adhesive layer 20, in a state where the surface totally occupied by the low thermal conduction portion 24a faced the pressure sensitive adhesive layer 20. The second substrate 24A was bonded to the pressure sensitive adhesive layer 20, such that the extension direction of the high thermal conduction portion 24b coincided with the first substrate 12A, the end lines of the high thermal conduction portion and the low thermal conduction portion coincided with each other, and the high and low thermal conduction portions alternate with the first substrate 12A (see FIGS. 4A to 4C).

In this way, a thermoelectric conversion module was prepared which was obtained by connecting in series 885 thermoelectric conversion elements having the same layer constitution as the thermoelectric conversion element 10 shown in FIGS. 1A to 1C, except that the thermoelectric conversion elements of this module did not have the adhesive layer 14 and the oxide layer 18.

Example 1-2

A thermoelectric conversion module was prepared in the same manner as in Example 1, except that the electrode 26 was changed to an electrode 26 having a thickness of 1 μm consisting of Al (Seebeck coefficient: −2.3 μV/K).

Example 1-3

A thermoelectric conversion module was prepared in the same manner as in Example 1, except that the electrode 26 was changed to an electrode 26 having a thickness of 1 μm consisting of Pt (Seebeck coefficient: −5.2 μV/K).

Comparative Example

A thermoelectric conversion module was prepared in the same manner as in Example 1, except that the electrode 26 was changed to an electrode 26 having a thickness of 1 μm consisting of Au (Seebeck coefficient: 2 μV/K).

<Measurement of Power Generation Capacity>

The prepared thermoelectric conversion module was interposed between a heated copper plate and a copper plate connected to a cold water circulating device, and a temperature of the heated copper plate was controlled such that a temperature difference of 10° C. was caused between the two copper plates.

Furthermore, the electrode of the thermoelectric conversion layers of the uppermost stream that are connected to each other in series and the electrode of the thermoelectric conversion layers of the lowermost stream were connected to a source meter (manufactured by Keithley Instruments, Inc., SOURCE METER 2450), an open-circuit voltage and a short-circuit current were measured, and a power generation capacity was determined by the following equation.

(Power generation capacity)=0.25×(open-circuit voltage)×(short-circuit current)

The results are shown in the following Table 1.

TABLE 1

| | Seebeck coefficient of electrode [μV/K] | Open-circuit voltage [mV] | Power generation capacity [μW] |
| --- | --- | --- | --- |
| Example 1-1 | −15.4 | 140 | 2 |
| Example 1-2 | −2.3 | 110 | 1.4 |
| Example 1-3 | −5.2 | 115 | 1.5 |
| Comparative Example | 2 | 100 | 1.2 |

The Seebeck coefficient of the thermoelectric conversion layer was 52 μV/K in all examples.

As shown in Table 1, in the thermoelectric conversion module using the thermoelectric conversion element of the present invention in which the thermoelectric conversion layer 16 has a positive Seebeck coefficient and the electrode 26 has a negative Seebeck coefficient, a better thermoelectric conversion performance is obtained than in the thermoelectric conversion module of the comparative example in which both of the thermoelectric conversion layer 16 and the electrode 26 have a positive Seebeck coefficient.

Example 2

The same first substrate 12A and second substrate 24A as those of Example 1-1 were prepared.

On a surface, which was totally occupied by a polyimide layer, of the first substrate, by a vacuum vapor deposition method using a metal mask, the electrode 26 was formed which was for the same 885 thermoelectric conversion layers as those in Example 1-1, consisted of Ni, and had a thickness of 1 μm.

Then, in the same manner as in Example 1-1, 885 thermoelectric conversion layers 16b having a thickness of 4.2 μm were formed. The thermoelectric conversion layers 16b were formed such that they cover the end of the electrode 26 by 0.1 mm (see FIG. 3B).

The formed thermoelectric conversion layers 16 had an approximately square pyramid shape which had a lower surface with a size of 1.1×1.1 mm and an upper surface with a size of 0.75×0.75 mm and in which the end in the plane direction was tapered as shown in FIG. 3A.

Thereafter, a thermoelectric conversion module was prepared in the same manner as in Example 1-1.

In this way, a thermoelectric conversion module was prepared which was obtained by connecting in series 885 thermoelectric conversion elements having the same layer constitution as the thermoelectric conversion element 10 shown in FIGS. 1A to 1C, except that the thermoelectric conversion layer 16b covers the end of the electrode 26, and thermoelectric conversion elements in this module did not have the adhesive layer 14 and the oxide layer 18.

Example 3

A thermoelectric conversion module was prepared in the same manner as in Example 2, except that, prior to the formation of the electrode 26, on a surface, which was totally occupied by a polyimide layer, of the first substrate 12A, a silicon oxide layer having a thickness of 50 nm was formed as the adhesive layer 14 by an EB vapor deposition method.

In this way, a thermoelectric conversion module was prepared which was obtained by connecting in series 885 thermoelectric conversion elements having the same layer constitution as the thermoelectric conversion element 10 shown in FIGS. 1A to 1C, except that the thermoelectric conversion layer 16b covered the end of the electrode 26, and the thermoelectric conversion elements in this module did not have the oxide layer 18.

Example 4

A thermoelectric conversion module was prepared in the same manner as in Example 2, except that, prior to the formation of the electrode 26, on a surface, which was totally occupied by a polyimide layer, of the first substrate 12A, a silicon oxide layer having a thickness of 50 nm was formed as the adhesive layer 14 by an EB vapor deposition method, and after the formation of the thermoelectric conversion layer 16, a silicon oxide layer having a thickness of 150 nm that covered the thermoelectric conversion layer 16 and the electrode 26 was formed as the oxide layer 18 by an EB vapor deposition method.

In this way, a thermoelectric conversion module was prepared which was obtained by connecting in series 885 thermoelectric conversion elements having the same layer constitution as the thermoelectric conversion element 10 shown in FIGS. 1A to 1C, except that the thermoelectric conversion layer 16b covered the end of the electrode 26.

Example 5

A thermoelectric conversion module was prepared in the same manner as in Example 3, except that, after the formation of the thermoelectric conversion layer 16, by a vacuum vapor deposition method, a Cu layer, which covered the end face of the thermoelectric conversion layer 16 and the upper surface of the thermoelectric conversion layer 16 by 0.1 mm, was connected to the electrode 26, and had a width of 0.1 mm and a thickness of 1 µm, was formed as the connection portion 26b.

Accordingly, in the present example, as shown in FIG. 3C, the electrode 26 and the thermoelectric conversion layer 16 are directly connected to each other and connected to each other through the connection portion 26b.

In this way, a thermoelectric conversion module was prepared which was obtained by connecting in series 885 thermoelectric conversion elements having the same layer constitution as the thermoelectric conversion element 10 shown in FIGS. 1A to 1C, except that the thermoelectric conversion layer 16b covered the end of the electrode 26, and the thermoelectric conversion elements in this module had the connection portion 26b but did not have the oxide layer 18.

Example 6

A thermoelectric conversion module was prepared in the same manner as in Example 5, except that, after the formation of the connection portion 26b, a silicon oxide layer having a thickness of 150 nm, which covered the thermoelectric conversion layer 16 and the electrode 26, was formed as the oxide layer 18 by an EB vapor deposition method.

In this way, a thermoelectric conversion module was prepared which was obtained by connecting in series 885 thermoelectric conversion elements having the same layer constitution as the thermoelectric conversion element 10 shown in FIGS. 1A to 1C, except that the thermoelectric conversion layer 16b covered the end of the electrode 26, and the thermoelectric conversion elements in this module had the connection portion 26b.

Example 7

A thermoelectric conversion module was prepared in the same manner as in Example 6, except that the pressure sensitive adhesive layer 20 was formed of a double-sided tape (manufactured by NITTO DENKO CORPORATION, double-sided tape No. 5601, acrylic) having a thickness of 10 µm.

In this way, a thermoelectric conversion module was prepared which was obtained by connecting in series 885 thermoelectric conversion elements having the same layer constitution as the thermoelectric conversion element 10 shown in FIGS. 1A to 1C, except that the thermoelectric conversion layer 16b covered the electrode 26, and the thermoelectric conversion elements in this module had the connection portion 26b.

Example 8

A thermoelectric conversion module was prepared in the same manner as in Example 5, except that the electrode 52 was formed of Al, and the adhesive layer 14 was not formed.

In this way, a thermoelectric conversion module was prepared which was obtained by connecting in series 885 thermoelectric conversion elements having the same layer constitution as the thermoelectric conversion element 10 shown in FIGS. 1A to 1C, except that the thermoelectric conversion layer 16b covered the end of the electrode 26, the thermoelectric conversion elements in this module had the connection portion 26b but did not have the adhesive layer 14 and the oxide layer 18.

Example 9

In the same manner as in Example 3, the adhesive layer 14, the thermoelectric conversion layer 16, and electrodes were formed. Here, as the electrodes, the electrode bodies 52a and 54a shown in FIG. 2 that separated from the thermoelectric conversion layer 16 by 0.1 mm were formed.

Then, the thermoelectric conversion layer 16 was connected to the electrode bodies 52a and 54a, and Cu layers having a thickness of 1 µm was formed as connection portions 52b and 54b by a vacuum vapor deposition method. The connection portions were formed such that they covered the end of the upper surface of the thermoelectric conversion layer 16 by 0.1 mm and the end of the upper surface of the electrode body by 0.1 mm.

A thermoelectric conversion module was prepared in the same manner as in Example 3, except that the aforementioned constitution was adopted.

In this way, a thermoelectric conversion module was prepared which was obtained by connecting in series 885 thermoelectric conversion elements having the same layer constitution as the thermoelectric conversion element 50 shown in FIG. 2, except that the thermoelectric conversion elements in this module did not have the oxide layer 18.

Example 10

A thermoelectric conversion module was prepared in the same manner as in Example 5, except that the material forming the connection portion 26b was changed to Au from Cu.

In this way, a thermoelectric conversion module was prepared which was obtained by connecting in series 885 thermoelectric conversion elements having the same layer constitution as the thermoelectric conversion element 10 shown in FIGS. 1A to 1C, except that the thermoelectric conversion layer 16b covered the end of the electrode 26, and the thermoelectric conversion elements in this module had the connection portion 26b but did not have the oxide layer 18.

Example 11

A thermoelectric conversion module was prepared in the same manner as in Example 5, except that the material forming the electrode 26 was changed to a laminate consisting of Cr having a thickness of 50 nm and Ni having a thickness of 1,000 nm from Ni.

In this way, a thermoelectric conversion module was prepared which was obtained by connecting in series 885 thermoelectric conversion elements having the same layer constitution as the thermoelectric conversion element 10 shown in FIGS. 1A to 1C, except that the thermoelectric conversion layer 16b covered the end of the electrode 26, and the thermoelectric conversion elements in this module had the connection portion 26b but did not have the oxide layer 18.

[Preparation of Coating Composition B that Will Become Thermoelectric Conversion Layer]

EC (manufactured by Meijo Nano Carbon., average length of CNT: equal to or greater than 1 μm) as single-layer CNT and sodium deoxycholate (manufactured by TOKYO CHEMICAL INDUSTRY CO., LTD.) were added to 20 ml of water such that a mass ratio of CNT/sodium deoxycholate became 25/75, thereby preparing a solution.

This solution was mixed for 7 minutes by using a mechanical homogenizer (manufactured by SMT Corporation, HIGH-FLEX HOMOGENIZER HF93), thereby obtaining a premix.

By using a thin film spin system high-speed mixer "FIL-MIX 40-40 model" (manufactured by PRIMIX Corporation), a dispersion treatment was performed on the obtained premix for 2 minutes at a circumferential speed of 10 m/sec and then for 5 minutes at a circumferential speed of 40 m/sec in a constant-temperature tank with a temperature of 10° C., by a high-speed spinning thin film dispersion method, thereby preparing a coating composition B that will become the thermoelectric conversion layer 16.

<Measurement of Electric Conductivity and Seebeck Coefficient>

A plastic film having a thickness of 25 μm was coated with the coating composition B, followed by drying for 30 minutes at 50° C. and then for 30 minutes at 120° C. Then, the film was impregnated with ethanol for 1 hour such that sodium deoxycholate was removed, and then dried for 30 minutes at 50° C. and then for 150 minutes at 120° C., thereby forming a thermoelectric conversion layer having a thickness of 10 μm.

As a result of checking the thermoelectric conversion layer by thermogravimetric·differential thermal analysis, it was confirmed that sodium deoxycholate did not remain in the thermoelectric conversion layer. A Seebeck coefficient S of the thermoelectric conversion layer was measured. As a result, the Seebeck coefficient was found to be 51 [μV/K].

Example 12

An adhesive-free copper-clad polyimide substrate (FELIOS R-F775, manufactured by Panasonic Electric Works Co., Ltd.) was prepared. The copper-clad polyimide substrate had a size of 110×110 mm, a thickness of a polyimide layer was 25 μm, and a thickness of a Cu layer was 70 μm.

By etching the copper layer of the copper-clad polyimide substrate, copper stripe patterns having a width of 0.5 mm and an interval of 0.5 mm were formed. In this way, the first substrate 12A and the second substrate 24A were prepared in each of which belt-like high thermal conduction portions having a thickness of 70 μm and a width of 0.5 mm were arranged at an interval of 0.5 mm in a direction orthogonal to the extension direction of the belt on the surface of sheet-like low thermal conduction portion having a thickness of 25 μm.

Next, on a surface (planar surface), which was totally occupied by a polyimide layer, of the first substrate 12A, films of Cr, Ni (Seebeck coefficient: −15.4 μV/K), and Ag were formed in this order by a vacuum vapor deposition method using a metal mask, thereby forming the electrode 26 (28) having three layers consisting of a Cr electrode, a Ni electrode, and a Ag electrode. The Cr electrode had a thickness of 50 nm, the Ni electrode had a thickness of 1 μm, and the Ag electrode had a thickness of 200 nm. The Cr electrode mainly functions as an adhesive layer in the electrode 26. The Ag electrode was formed only in the vicinity of the end covered with the thermoelectric conversion layer 16 which will be formed later (see FIG. 6A).

In this example using the coating composition B, just as in the aforementioned examples, only the electrode 26 will be described as an electrode.

By using the coating composition B prepared as above, on a surface, which was totally occupied by a polyimide layer and onto which the electrode was vapor-deposited, of the first substrate 12A, 3213 patterns of the coating composition B having a size of 0.5×1.5 mm were formed at an interval of 1 mm in the extension direction of the high thermal conduction portion 12b and at an interval of 0.5 mm in the arrangement direction of the high thermal conduction portion 12b, and dried for 30 minutes at 50° C. and then for 30 minutes at 120° C. The patterns of the coating composition B were formed by metal mask printing by setting a squeegee direction to be the direction in which the thermoelectric conversion elements are connected in series, under the conditions of an attack angle of 20°, a clearance of 1.5 mm, a printing pressure of 0.3 MPa, and an indentation amount of 0.5 mm.

Figure 6A:
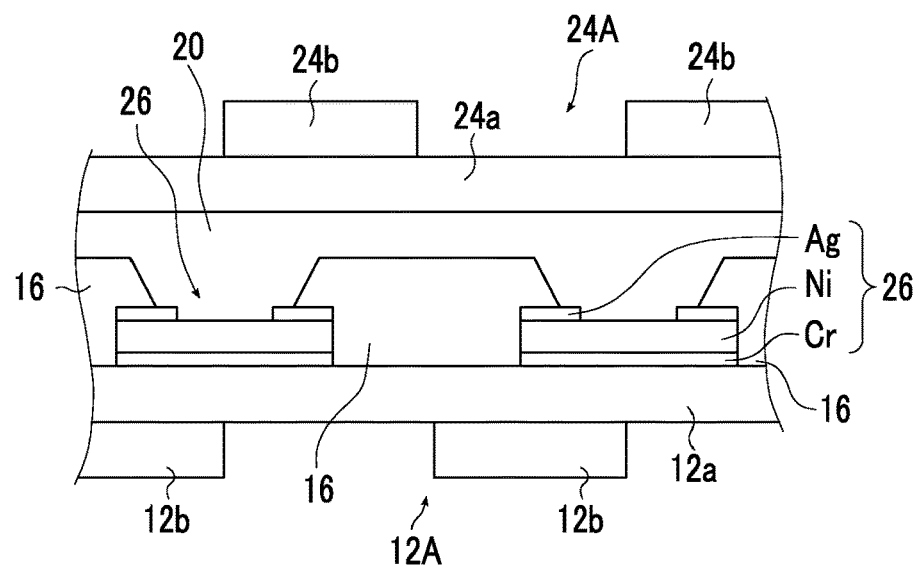
FIGS. 6A and 6B are schematic views for illustrating thermoelectric conversion modules prepared in examples of the present invention.

Then, the resultant was impregnated with ethanol for 1 hour to remove sodium deoxycholate and dried for 30 minutes at 50° C. and then for 150 minutes at 120° C., thereby forming 3213 thermoelectric conversion layers 16. The thermoelectric conversion layers 16 were formed such that they covered the end of the electrode 26 by about 0.15 mm as shown in FIG. 6A. Furthermore, the top portion of each of the thermoelectric conversion layers 16 slanted further than the electrode 26, in the form of an approximately square pyramid.

The thermoelectric conversion layer 16 had a thickness of 5.0 μm. The patterns of the thermoelectric conversion layer 16 having a size of 0.5×1.5 mm was formed such that the center of the thermoelectric conversion layer 16 in the plane direction coincided with the boundary between the low thermal conduction portion 12a and the high thermal conduction portion 12b, and the thermoelectric conversion layers 16 were formed in alternate positions in the upper and lower lines as shown in FIG. 4B. As a result of checking the thermoelectric conversion layer by thermogravimetric·differential thermal analysis, it was confirmed that sodium deoxycholate did not remain in the thermoelectric conversion layer 16.

In the manner described above, 3213 thermoelectric conversion layers 16 were connected in series as shown in FIG. 4B.

Next, as the pressure sensitive adhesive layer 20, a double-sided tape (manufactured by NITTO DENKO CORPORATION, No. 5603, acrylic) having a thickness of 30 μm was bonded onto a surface (planar surface), which was totally occupied by a polyimide layer, of the second substrate 24A.

Furthermore, the second substrate 24A to which the double-sided tape was bonded was bonded in a state where a surface, on which the thermoelectric conversion layer 16 and the electrode 26 were formed, of the first substrate 12A faced upward, such that the entirety of the upper surface was covered. The second substrate 24A was bonded to the first substrate 12A, such that the extension direction of the high thermal conduction portion coincided with the first substrate 12A, the end lines of the high thermal conduction portion and the low thermal conduction portion coincided with each other, and the high and low thermal conduction portions alternate with the first substrate 12A (see FIGS. 4A to 4C).

In this way, a thermoelectric conversion module was prepared which was obtained by connecting 3213 thermoelectric conversion elements in series as schematically shown in FIG. 6A.

Example 13

The same first substrate 12A as in Example 12 was prepared. On a surface (planar surface), which was totally occupied by a polyimide layer, of the first substrate 12A, by a vacuum vapor deposition method using a metal mask, films of Cr and Ni (Seebeck coefficient: −15.4 μV/K) that will become the electrode 26 were formed in this order. The Cr electrode had a thickness of 50 nm, and the Ni electrode had a thickness of 1 μm. The Cr electrode mainly functions as an adhesive layer in the electrode 26.

Next, by using the coating composition B prepared as above, on the surface (planar surface), which was totally occupied by a polyimide layer and onto which the Ni electrode and the like were vapor-deposited, of the first substrate 12A, 3213 patterns of the coating composition B having a size of 0.5×1.5 mm were formed at an interval of 1.0 mm in the extension direction of the high thermal conduction portion and at an interval of 0.5 mm in the arrangement direction of the high thermal conduction portion, and dried for 30 minutes at 50° C. and then for 30 minutes at 120° C. The patterns of the coating composition B were formed by metal mask printing under the same conditions as in Example 12.

Figure 6B:
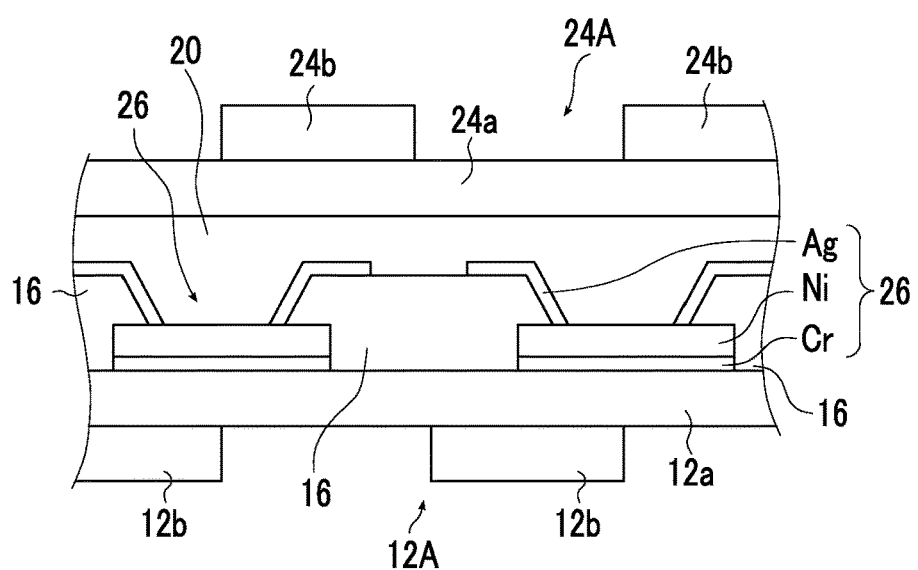

Then, by impregnating the resultant in ethanol for 1 hour so as to remove sodium deoxycholate, followed by drying for 30 minutes at 50° C. and then for 150 minutes at 120° C., thereby forming 3213 thermoelectric conversion layers 16. The thermoelectric conversion layers 16 were formed such that they covered the end of the electrode 26 by about 0.15 mm as shown in FIG. 6B. Furthermore, the top portion of each of the thermoelectric conversion layers 16 slanted further than the electrode 26, in the form of an approximately square pyramid.

The thermoelectric conversion layer had a thickness of 5.0 μm. The patterns of the thermoelectric conversion layer 16 having a size of 0.5×1.5 mm were formed such that, as shown in FIG. 4B, the center of the thermoelectric conversion layer 16 in the plane direction coincided with the boundary between the low thermal conduction portion 12a and the high thermal conduction portion 12b, and the thermoelectric conversion layers 16 were formed in alternate positions in the upper and lower lines. As a result of checking the thermoelectric conversion layer by thermogravimetric·differential thermal analysis, it was confirmed that sodium deoxycholate did not remain in the thermoelectric conversion layer 16.

Then, by vacuum vapor deposition method using a metal mask, a Ag film was formed which started from the position where the upper surface of the Ni electrode and the thermoelectric conversion layer 16 contacted each other, passed the lateral surface of the thermoelectric conversion layer 16, and reaches the upper surface of the thermoelectric conversion layer 16. In this way, the electrode 26 having three layers consisting of a Cr electrode, a Ni electrode, and a Ag electrode (see FIG. 6B). The Ag electrode had a thickness of 200 nm.

In the manner described above, 3213 thermoelectric conversion layers 16 were connected to each other in series as shown in FIG. 4B.

Next, the same first substrate 12A as in Example 12 was prepared. Onto a surface (planar surface), which was totally occupied by a polyimide layer, of the second substrate 24A, a double-sided tape (manufactured by NITTO DENKO CORPORATION, No. 5603, acrylic) having a thickness of 30 μm was bonded as the pressure sensitive adhesive layer 20.

In a state where the surface, on which the thermoelectric conversion layer 16 and the electrode 26 were formed, of the first substrate 12A faced upward, the second substrate 24A to which the double-sided tape was bonded was bonded such that the entirety of the upper surface was covered. The second substrate 24A was bonded to the pressure sensitive adhesive layer 20 such that the extension direction of the high thermal conduction portion coincided with the first substrate, the end lines of the high thermal conduction portion and the low thermal conduction portion coincided with each other, and the high and low thermal conduction portions and the first substrate alternated with each other (see FIGS. 4A to 4C).

In this way, a thermoelectric conversion module obtained by connecting 3213 thermoelectric conversion layers 16 in series was prepared as schematically shown in FIG. 6B.

Example 14

A thermoelectric conversion module was prepared in the same manner as in Example 13, except that the pressure sensitive adhesive layer 20 was changed to a double-sided tape (manufactured by NITTO DENKO CORPORATION, No. 5600, acrylic) having a thickness of 5 μm.

Example 15

A thermoelectric conversion module was prepared in the same manner as in Example 13, except that the pressure sensitive adhesive layer 20 was changed to a double-sided tape (manufactured by NITTO DENKO CORPORATION, No. 5600, acrylic) having a thickness of 5 μm, and the Ag electrode of the electrode 26 was changed to a Au electrode having a thickness of 200 nm.

Example 16

A thermoelectric conversion module was prepared in the same manner as in Example 13, except that the pressure sensitive adhesive layer 20 was changed to a double-sided tape (manufactured by Teraoka Seisakusho Co., Ltd., 7084 #4, silicone-based) having a thickness of 40 μm.

[Evaluation]

The thermoelectric conversion modules of Examples 2 to 16 prepared as above were evaluated in terms of a power generation capacity and subjected to a bending test and a heat resistance test. Herein, the bending test and the heat resistance test were also performed on the thermoelectric conversion modules of Examples 1-1 to 1-3 described above.

<Power generation capacity>

A power generation capacity was measured in the same manner as in Example 1-1.

<Bending Test>

After the power generation capacity was measured, a bending test was performed on the thermoelectric conversion modules based on JIS K 5600. By using a cylindrical mandrel having a diameter of 32 mm, the module was bent at 180°.

After the bending test was performed, the power generation capacity of the thermoelectric conversion modules was measured in the same manner as described above. The power generation capacities were compared, and a rate of change thereof was determined and evaluated based on the following evaluation standards.

A: a rate of change of equal to or lower than 5%
B: a rate of change of higher than 5% and equal to or less than 10%
C: a rate of change of higher than 10% and equal to or less than 15%

D: a rate of change of higher than 15% and equal to or less than 20%

<Heat Resistance Test>

The prepared thermoelectric conversion module was left to stand for 50 hours in a constant-temperature tank with a temperature of 120° C., and then the output thereof was measured (output A). Thereafter, the thermoelectric conversion module was left to stand for another 300 hours in a constant-temperature tank with a temperature of 120° C., and the output thereof was measured (output B) and evaluated based on the following evaluation standards.

A: a rate of change of the output B with respect to the output A was equal to or lower than 5%.

B: a rate of change of the output B with respect to the output A was higher than 5% and equal to or lower than 10%.

C: a rate of change of the output B with respect to the output A was higher than 10% and equal to or lower than 20%.

The results are shown in the following Table 2.

TABLE 2

|  | Electrode | | Adhesive layer | Oxide layer | Pressure sensitive adhesive layer [μm] | Power generation capacity [μW] | Bending test | Heat resistance test |
| --- | --- | --- | --- | --- | --- | --- | --- | --- |
|  | Material (connection portion) | Covering of upper surface of conversion layer | | | | | | |
| Example 1-1 | Ni | Present (Ni) | Absent | Absent | 30 | 1.8 | D | C |
| Example 1-2 | Al | Present (Al) | Absent | Absent | 30 | 1.4 | C | C |
| Example 1-3 | Pt | Present (Pt) | Absent | Absent | 30 | 1.5 | D | C |
| Example 2 | Ni | Absent | Absent | Absent | 30 | 1.6 | C | C |
| Example 3 | Ni | Absent | Present | Absent | 30 | 1.6 | B | C |
| Example 4 | Ni | Absent | Present | Present | 30 | 1.6 | B | B |
| Example 5 | Ni(Cu) | Present (Cu) | Present | Absent | 30 | 2.2 | B | C |
| Example 6 | Ni(Cu) | Present (Cu) | Present | Present | 30 | 2.2 | B | B |
| Example 7 | Ni(Cu) | Present (Cu) | Present | Present | 10 | 2.4 | B | B |
| Example 8 | Al(Cu) | Present (Cu) | Absent | Absent | 30 | 1.5 | C | C |
| Example 9 | Ni(Cu) | Present (Cu) | Present | Absent | 30 | 2 | B | C |
| Example 10 | Ni(Cu) | Present (Cu) | Present | Absent | 30 | 2.6 | B | C |
| Example 11 | Cr/Ni(Cu) | Present (Cu) | Present | Absent | 30 | 2.3 | B | C |
| Example 12 | Cr/Ni(Ag) | Absent | Present | Absent | 30 | 6.5 | B | C |
| Example 13 | Cr/Ni(Ag) | Present (Ag) | Present | Absent | 30 | 6.7 | B | C |
| Example 14 | Cr/Ni(Ag) | Present (Ag) | Present | Absent | 5 | 9.9 | A | A |
| Example 15 | Cr/Ni(Au) | Present (Au) | Present | Absent | 5 | 10.1 | A | A |
| Example 16 | Cr/Ni(Ag) | Present (Ag) | Present | Absent | 40 | 5.9 | B | A |

For forming the thermoelectric conversion layer, the coating composition A was used in Examples 1-1 to 11, and the coating composition B was used in Examples 12 to 16.
A silicone-based pressure sensitive adhesive layer was used only in Example 16, and an acrylic pressure sensitive adhesive layer was used in all of other examples.
The number of thermoelectric conversion elements of the thermoelectric conversion module was 885 in Examples 1-1 to 11 and 3213 in Examples 12 to 16.

As shown in Table 2, in the thermoelectric conversion module using the thermoelectric conversion element of the present invention in which the thermoelectric conversion layer 16 has a positive Seebeck coefficient and the electrode 26 has a negative Seebeck coefficient, a better thermoelectric conversion performance is obtained than in the thermoelectric conversion module (power generation capacity: 1.2 μW) of comparative examples in which both of the thermoelectric conversion layer 16 and the electrode 26 have a positive Seebeck coefficient.

As shown in Examples 1-1 to 1-3 and 5 to 11, by covering the upper surface of the thermoelectric conversion layer 16 with the electrode, a better thermoelectric conversion performance is obtained. Particularly, as shown in Examples 5 to 11, by providing the connection portion connecting the electrode and the thermoelectric conversion layer to each other and using Cu, which has conductivity higher than that of the electrode body (Ni), as a material forming the connection portion, a better thermoelectric conversion performance is obtained.

As shown in Example 7, by reducing the thickness of the pressure sensitive adhesive layer, a better thermoelectric conversion performance is obtained.

As shown in Examples 4 to 7 and 9 to 11, by providing the adhesive layer 14 under the electrode, bending resistance can be improved.

Through the comparison of Examples 6 and 7 and Examples 13 and 14, it was understood that by reducing the thickness of the pressure sensitive adhesive layer 20, a temperature difference of the thermoelectric conversion layer 16 is easily caused, and hence the output is improved. In addition, through the comparison of Examples 13 and 14, it was understood that by reducing the thickness of the pressure sensitive adhesive layer 20, the bending resistance and heat resistance are also improved.

Through the comparison of Examples 13 and 16, it was understood that by using a silicone-based pressure sensitive adhesive instead of an acrylic pressure sensitive adhesive for the pressure sensitive adhesive layer 20, the heat resistance is improved.

Even in a case where a thermoelectric conversion module evaluated to be "D" in the bending test and "C" in the heat resistance test, the module is enough for being used as a thermoelectric conversion module.

Example 17

To a heating source (surface temperature: 80° C.) having a curved surface shape (φ 120 mm), a thermoelectric conversion module prepared in the same manner as in Example 14 was bonded using a thermally conductive adhesive sheet (manufactured by Shin-Etsu Silicone, TC-50TXS2).

Furthermore, to the surface of the thermoelectric conversion module, a corrugated fin (manufactured by Saijo Inx Co., Ltd., COA-5B2D75B, size: 100×100 mm) was bonded using a thermally conductive adhesive sheet (manufactured by NITTO DENKO CORPORATION, TR5912F).

Electrodes of thermoelectric conversion elements, which were connected to each other in series, in the uppermost stream and electrodes of the same thermoelectric conversion elements in the lowermost stream were connected to source meter (manufactured by Keithley Instruments, Inc., SOURCE METER 2450), an open-circuit voltage and an open-circuit current were measured, and a power generation capacity was determined. As a result, an output of 6.0 µW was obtained.

Example 18

To a heating source (surface temperature: 80° C.) having a curved surface shape (φ 120 mm), a thermoelectric conversion module prepared in the same manner as in Example 14 was bonded using a thermally conductive adhesive sheet (manufactured by Shin-Etsu Silicone, TC-50TXS2).

To the surface of the thermoelectric conversion module, a folding fin (height 25 mm×pitch 5.5 mm×plate thickness 0.2 mm, made of aluminum, size 100×100 mm) was bonded using a thermally conductive adhesive sheet (manufactured by NITTO DENKO CORPORATION, TR5912F).

As a result of determining a power generation capacity in the same manner as in Example 17, an output of 8.9 µW was obtained.

Example 19

In the same manner as in Example 18, a thermoelectric conversion module was bonded to a heating source and a folding fin (height 25 mm×pitch 5.5 mm×plate thickness 0.2 mm, made of aluminum, size 100×100 mm) and then air-cooled at a wind speed of 3.5 m/s, and in this state, a power generation capacity was determined in the same manner as in Example 17. As a result, an output of 41 LW was obtained.

As described above, it is understood that the thermoelectric conversion module of the present invention exhibits an excellent output even if a curved surface-like heat source is used. Furthermore, by air-cooling the heat dissipating fin, heat dissipation is accelerated, a temperature difference is caused, and hence the output is improved. From this result, it is understood that the thermoelectric conversion module of the present invention can be suitably used for both of a planar heat source and a curved surface-like heat source.

The above results clearly show the effects of the present invention.

EXPLANATION OF REFERENCES 10, 50: thermoelectric conversion element
12: first substrate
12a, 24a: low thermal conduction portion
12b, 24b: high thermal conduction portion
14: adhesive layer
16, 16a, 16b: thermoelectric conversion layer
18: oxide layer
20: pressure sensitive adhesive layer
24: second substrate
26, 28, 52, 54: electrode
26b, 28b, 52b, 54b: connection portion
52a, 54a: electrode body

What is claimed is:

1. A thermoelectric conversion element comprising:
a first substrate having a high thermal conduction portion, which has a thermal conductivity higher than that of other regions, in at least a portion in a plane direction;
a thermoelectric conversion layer which is formed on the first substrate, consists of an organic material, and has a positive Seebeck coefficient;
a second substrate which is formed on the thermoelectric conversion layer and has a high thermal conduction portion having a thermal conductivity higher than that of other regions of the second substrate in at least a portion in the plane direction and in which the high thermal conduction portion does not completely overlap the high thermal conduction portion of the first substrate in the plane direction; and
a pair of electrodes which are connected to the thermoelectric conversion layer such that the thermoelectric conversion layer is interposed between the electrodes in the plane direction;
wherein both electrodes of the pair of electrodes comprise a metal material having a negative Seebeck coefficient.

2. The thermoelectric conversion element according to claim 1,
wherein each of the pair of electrodes covers a portion of an upper surface of the thermoelectric conversion layer in the plane direction.

3. The thermoelectric conversion element according to claim 1,
wherein each of the pair of electrodes has a connection portion, which connects to the thermoelectric conversion layer and consists of a material having an electric conductivity higher than that of the metal material constituting the electrode.

4. The thermoelectric conversion element according to claim 3,
wherein the electrodes and the thermoelectric conversion layer are directly connected to each other and connected to the connection portion as well.

5. The thermoelectric conversion element according to claim 1, further comprising:
an adhesive layer between the first substrate and the pair of electrodes.

6. The thermoelectric conversion element according to claim 1, further comprising:
an insulating inorganic oxide film or silicon nitride film that covers the thermoelectric conversion layer and the pair of electrodes.

7. The thermoelectric conversion element according to claim 1,
wherein an end face of the thermoelectric conversion layer in the plane direction has a tapered shape.

8. The thermoelectric conversion element according to claim 1,
wherein the thermoelectric conversion layer contains carbon nanotubes.

9. The thermoelectric conversion element according to claim 1,
wherein the metal material having a negative Seebeck coefficient is Ni or a Ni alloy.

10. A thermoelectric conversion module comprising:
a plurality of the thermoelectric conversion elements according to claim 1 that is connected to each other in series.

11. The thermoelectric conversion module according to claim 10, further comprising:
a heat dissipating fin contacting the high thermal conduction portion of any one of the first and second substrates.

12. The thermoelectric conversion module according to claim 11,
wherein the heat dissipating fin and the high thermal conduction portion are bonded to each other by a thermally conductive adhesive sheet or a thermally conductive adhesive.

* * * * *